(12) United States Patent
Kazikawa

(10) Patent No.: US 9,693,419 B2
(45) Date of Patent: Jun. 27, 2017

(54) LIGHT SOURCE SUBSTRATE, DISPLAY APPARATUS, AND LIGHT SOURCE SUBSTRATE INSPECTION METHOD

(71) Applicant: Sharp Kabushiki Kaisha, Osaka (JP)

(72) Inventor: Yosuke Kazikawa, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/892,561

(22) PCT Filed: Feb. 25, 2014

(86) PCT No.: PCT/JP2014/054494
§ 371 (c)(1),
(2) Date: Nov. 19, 2015

(87) PCT Pub. No.: WO2014/188749
PCT Pub. Date: Nov. 27, 2014

(65) Prior Publication Data
US 2016/0128143 A1    May 5, 2016

(30) Foreign Application Priority Data
May 22, 2013  (JP) ................................ 2013-107973

(51) Int. Cl.
| H05B 33/08 | (2006.01) |
| F21V 8/00 | (2006.01) |
| G01R 31/44 | (2006.01) |
| G02F 1/1335 | (2006.01) |
| G02F 1/13 | (2006.01) |

(52) U.S. Cl.
CPC ........... *H05B 33/089* (2013.01); *G01R 31/44* (2013.01); *G02B 6/0083* (2013.01); *G02F 1/1309* (2013.01); *G02F 1/1336* (2013.01); *H05B 33/0821* (2013.01); *H05B 33/0824* (2013.01); *G02F 2001/133612* (2013.01)

(58) Field of Classification Search
CPC   H05B 33/0821; H05B 33/089; G02B 6/0083; G01R 31/44; G02F 1/1309; G02F 1/1336
See application file for complete search history.

(56) References Cited

U.S. PATENT DOCUMENTS 5,457,450 A * 10/1995 Deese ................... G08G 1/095
340/641
2007/0170876 A1   7/2007 Ito et al.

FOREIGN PATENT DOCUMENTS

| JP | 2006-352025 A | 12/2006 |
| JP | 2007-200610 A | 8/2007 |
| JP | 2010-98209 A | 4/2010 |

* cited by examiner

*Primary Examiner* — Thomas M Sember
(74) *Attorney, Agent, or Firm* — Chen Yoshimura LLP

(57) ABSTRACT

An LED substrate (light source substrate) includes: a substrate; a plurality of LEDs (light sources) mounted on the substrate; a power supply wiring line on the substrate that can supply power to the plurality of LEDs by connecting the plurality of LEDs in series; and an inspection wiring line that is disposed on the substrate and connected to a portion of the power supply wiring line that connects adjacent LEDs included in the plurality of LEDs.

17 Claims, 16 Drawing Sheets

LIGHT SOURCE SUBSTRATE, DISPLAY APPARATUS, AND LIGHT SOURCE SUBSTRATE INSPECTION METHOD

TECHNICAL FIELD

The present invention relates to a light source substrate, a display device, and a method of inspecting a light source substrate.

BACKGROUND ART

Conventionally, devices in which a plurality of LED elements have been disposed in a linear or planar shape have been used in photograph processing devices (film scanners) and the like. Patent Document 1 discloses a well-known example of such a device. Patent Document 1 discloses a device which divides a plurality of LED elements into groups of at least two or more LED elements that are interconnected, and which is provided with a forward voltage drop measuring method that measures the total forward voltage drop of the respective LED elements that form the respective groups. The forward voltage drop measuring method includes: a voltage detection unit for each of the respective groups that extracts a total forward voltage drop of the respective LED elements forming the group; a method for measuring the forward voltage drop extracted by the voltage detection unit; a method for comparing the measured forward voltage drop to a reference voltage; a method for determining whether or not the forward voltage drop satisfies a prescribed judging standard in accordance with the comparison result; and a method for displaying the determination result.

RELATED ART DOCUMENT

Patent Document

Patent Document 1: Japanese Patent Application Laid-Open Publication No. 2006-352025

Problems to be Solved by the Invention

The LED light source inspection method disclosed in Patent Document 1 uses a voltage detection unit or the like to measure a voltage between both ends of a group formed of a plurality of LED elements connected in series, or in other words, measures a voltage between the anode of an LED element located at one end of the group and the cathode of an LED element located at the other end of the group. If the difference between this voltage and a reference voltage falls outside an acceptable range, the method determines that at least one of the LED elements belonging to the group is not working properly.

However, while variations in the voltage drop of the LED elements due to manufacturing issues may occur within tolerable limits, the LED light source inspection method disclosed in Patent Document 1 does not take into account such individual variability in the voltage drop of the LED elements. Thus, depending on the number of LED elements connected in series, there is the possibility that this inspection method may fail to detect LED elements that are not working properly. In particular, LED elements used as light sources for a backlight device in a liquid crystal display device are generally brighter than LED elements used in photograph processing devices (film scanners). Thus, the tolerance for voltage drops tends to be larger for LED elements used in backlight devices. As a result, the inspection method disclosed in Patent Document 1 tended to have a higher likelihood of failing to detect defective LED elements when the LED elements were used as light sources for a backlight device.

SUMMARY OF THE INVENTION

The present invention was designed in light of the above-mentioned circumstances. An aim of the present invention is to increase reliability in detecting defective light sources.

Means for Solving the Problems

A light source substrate of the present invention includes: a substrate; a plurality of light sources mounted on the substrate; a power supply wiring line on the substrate, connecting the plurality of light sources in series so as to supply power to the plurality of light sources; and an inspection wiring line that is disposed on the substrate and connected to a portion of the power supply wiring line that connects adjacent light sources included in the plurality of light sources.

In such a configuration, the plurality of light sources mounted on the substrate are turned ON by receiving power via the power supply wiring line that is mounted on the substrate and that connects the plurality of light sources in series. When inspecting a plurality of light sources for the presence of defects, inspection is performed using the power supply wiring line and the inspection wiring line. If all of the light sources are inspected at one time using the power supply wiring line, the voltage drop of a single light source will fall within the tolerance range (the difference between the maximum value and the minimum value) for a voltage drop of all of the light sources. Thus, there is the possibility that defective light sources may not be detected. As a countermeasure, the inspection wiring line is connected to a portion of the power supply wiring line that connects adjacent light sources that are included in the plurality of light sources; thus, it becomes possible to divide the plurality of light sources mounted on the substrate into at least two groups and inspect the light sources by measuring a voltage drop between the inspection wiring line and one end of the power supply wiring line that is opposite to the inspection wiring line and measuring a voltage drop between the inspection wiring line and another end of the power supply wiring line that is opposite to the inspection wiring line, for example. Therefore, if the connection location of the inspection wiring line is set at an appropriate location relative to the power supply wiring line, the voltage drop of a single light source can be prevented from falling within the tolerance range of the voltage drop of an entire group of light sources disposed between the inspection wiring line and one end or another end of the power supply wiring line that is opposite to the inspection wiring line. As a result, there is an increase in reliability in detecting defective light sources.

The following configurations are preferred embodiments of the light source substrate of the present invention.

(1) The inspection wiring line is connected to the power supply wiring line such that ΔVfg is less than Vfmax, where ΔVfg is a difference between a maximum value and a minimum value of a tolerance for a voltage drop between the inspection wiring line and one end or another end of the power supply wiring line, as calculated from a specified tolerance for a voltage drop at a single one of the plurality of light sources, and Vfmax is a maximum value of the specified tolerance for the voltage drop at the single one of the plurality of light sources. By so doing, the voltage drop of a single light source can be more reliably prevented from falling within the tolerance range of the voltage drop of an entire group of light sources disposed between the inspection wiring line and one end or another end of the power supply wiring line that is opposite to the inspection wiring line.

(2) The inspection wiring line is connected to the power supply wiring line such that n is greater than Vfmax/ΔVf, and n1 and n2 are respectively less than Vfmax/ΔVf, where ΔVf is a difference between a maximum value and a minimum value for a voltage drop at a single light source included in the plurality of light sources, Vfmax is a maximum value of a tolerance for the voltage drop at the single light source, n is a total number of light sources included in the plurality of light sources, n1 is a number of light sources disposed between the inspection wiring line and one end of the power supply wiring line, and n2 is a number of light sources disposed between the inspection wiring line and another end of the power supply wiring line. In such a configuration, when "n", which is the total number of light sources included in the plurality of light sources, is greater than Vfmax/ΔVf and all of the light sources are inspected at the same time using the power supply wiring line, the voltage drop of a single light source will fall within the tolerance range for a voltage drop of all of the light sources. Thus, it is possible that defective light sources may not be detected. As a countermeasure, the inspection wiring line is connected to the power supply wiring line such that n1, which is the number of light sources disposed between the inspection wiring line and one end of the power supply wiring line that is opposite to the inspection wiring line, and n2, which is the number of light sources disposed between the inspection wiring line and another end of the power supply wiring line that is opposite to the inspection wiring line, are respectively lower than the value of Vfmax/ΔVf. Thus, the voltage drop of a single light source can be more reliably prevented from falling within the tolerance range of the voltage drop of an entire group of light sources disposed between the inspection wiring line and one end or another end of the power supply wiring line that is opposite to the inspection wiring line. In this way, it is possible to increase reliability in detecting defective light sources.

(3) The inspection wiring line is connected to the power supply wiring line such that n1 and n2 are equal to each other. In such a configuration, when the plurality of light sources mounted on a substrate are inspected by dividing the light sources into at least two groups, the tolerance range for voltage drops of an entire group of light sources disposed between the inspection wiring line and one end of the power supply wiring line that is opposite to the inspection wiring line is the same as the tolerance range of an entire group of light sources disposed between the inspection wiring line and another end of the power supply wiring line that is opposite to the inspection wiring line. Thus, it is possible to maintain a consistent level of inspection accuracy over at least two inspections.

(4) A plurality of the inspection wiring lines are disposed on the substrate so as to be connected to different portions of the power supply wiring line such that light sources included in the plurality of light sources are interposed therebetween. In such a configuration, light sources interposed between the plurality of inspection wiring lines can be inspected by measuring the voltage drop between the plurality of inspection wiring lines. Therefore, a plurality of light sources mounted on a substrate can be divided into three or more groups and then inspected. This type of configuration is especially useful when a large number of light sources are mounted on the substrate.

(5) The plurality of inspection wiring lines are connected to the power supply wiring line such that n3 is less than Vfmax/ΔVf and n is greater than Vfmax/ΔVf, where ΔVf is a difference between a maximum value and a minimum value for a voltage drop at a single one of the plurality of light sources, Vfmax is a maximum value of a tolerance for the voltage drop at the single light source, n is a total number of light sources included in the plurality of light sources, and n3 is a number of the light sources disposed between any pair of the inspection wiring lines that are adjacent to each other in the plurality of inspection wiring lines. In such a configuration, when "n", which is the total number of light sources included in the plurality of light sources, is greater than Vfmax/ΔVf and all of the light sources are inspected at the same time using the power supply wiring line, the voltage drop of a single light source will fall within the tolerance range of the voltage drop of all of the light sources. Thus, it is possible that defective light sources may not be detected. As a countermeasure, a plurality of inspection wiring lines are connected to the power supply wiring line such that n3, which is the number of light sources disposed between the plurality of inspection wiring lines, is less than Vfmax/ΔVf; thus, the voltage drop of a single light source can be more reliably prevented from falling within the tolerance range of the voltage drop of an entire group of light sources disposed between the plurality of inspection wiring lines. In this way, it is possible to increase reliability in detecting defective light sources.

(6) The plurality of light sources each include a semiconductor light-emitting element, and the light source substrate further includes a plurality of protection diodes that are each connected in parallel to a respectively different light source included in the plurality of light sources, and that have a polarity that is a reverse of a polarity of the light sources. In such a configuration, the semiconductor light-emitting elements included in the respective plurality of light sources generate light as a result of the power supply wiring line applying a forward bias voltage to the plurality of light sources. Meanwhile, when a reverse bias voltage is applied to the plurality of light sources via static electricity or the like, for example, current selectively flows to the protection diodes, which are individually connected in parallel to the light sources included in the above-mentioned plurality of light sources and which have a polarity opposite to the polarity of the light sources. Thus, the light sources can be protected.

(7) The plurality of protection diodes are Zener diodes that have a Zener voltage that is larger than a voltage drop at a single one of the plurality of light sources. Such a configuration uses Zener diodes, which have a Zener voltage that is higher than the voltage drop of a single light source, as protection diodes; thus, current can be prevented from flowing to the Zener diodes when the power supply wiring line applies a forward bias voltage to the plurality of light sources. Meanwhile, when forward bias static electricity is applied to the plurality of light sources, current selectively flows to the Zener diodes; thus, the light sources can be protected. In addition, even if one or more of the light sources included in the above-mentioned plurality of light sources are open, it is possible to provide current to other light sources by using the Zener diodes as a bypass.

(8) The inspection wiring line is connected to the power supply wiring line such that ΔVfg is smaller than Vfmax and is also smaller than Vzmin, where ΔVfg is a difference between a maximum value and a minimum value of a tolerance for a voltage drop between the inspection wiring line and one end or another end of the power supply wiring line, as calculated from a specified tolerance for a voltage drop at a single one of the plurality of light sources, Vfmax is a maximum value of the specified tolerance for the voltage drop at the single light source included in the plurality of light sources, and Vzmin is a minimum value of a specified tolerance for Zener voltage of a single one of the plurality of Zener diodes. In such a configuration, the voltage drop of a single light source and the Zener voltage of a single Zener diode can be more reliably prevented from falling within the tolerance range of the voltage drop of an entire group of light sources disposed between the inspection wiring line and one end or another end of the power supply wiring line opposite to the inspection wiring line. In this way, it is possible to increase reliability in detecting defective light sources.

(9) The light source substrate further includes a power supply terminal that is disposed on an end of the substrate and that is connected to an end of the power supply wiring line; and an inspection terminal that is disposed adjacent to the power supply terminal on the end of the substrate and that is connected to an end of the inspection wiring line. In such a configuration, the power supply terminal and the inspection terminal are disposed next to one another on the end of the substrate section; thus it becomes easier to connect the power supply terminal and the inspection terminal to an inspection device when inspection occurs. Specifically, if an inspection connector, which includes a terminal clamp that respectively contacts the power supply terminal and the inspection terminal, is provided in the inspection device, for example, it becomes easier to connect to the terminals which leads to an increase in work efficiency.

A display device of the present invention includes: an illumination device that has at least the above-mentioned light source substrate; and a display panel that displays images by utilizing light from the illumination device.

In such a display device, there is a high likelihood of being able to detect defective light sources on the light source substrate included in the illumination device. Thus, it is less likely that uneven brightness will occur in light provided to the display panel, which means that there will be an improvement in display quality of images displayed on the display panel. Furthermore, compared to light sources in light source substrates used in things such as photograph processing devices and the like, the plurality of light sources in light source substrates used in the illumination device of such a display device tend to be brighter. Thus, the tolerance of the voltage drop of a single light source tends to be higher in such a device and there is concern that defective light sources may not be detected. As a countermeasure, the plurality of light sources that are mounted on the substrate are divided into at least two groups and then inspected in the manner described above, thus increasing reliability in detecting defective light sources.

A method for inspecting a light source substrate that includes: a substrate; a plurality of light sources mounted on the substrate; a power supply wiring line on the substrate, connecting the plurality of light sources in series so as to supply power to the plurality of light sources; and an inspection wiring line that is disposed on the substrate and connected to a portion of the power supply wiring line that connects adjacent light sources included in the plurality of light sources, the method including: a first voltage measurement step that measures a voltage drop between the inspection wiring line and one end of the power supply wiring line that is opposite to the inspection wiring line; a first determination step that determines whether or not there is a defect in the light sources disposed between the inspection wiring line and the one end of the power supply wiring line by comparing the voltage drop measured during the first voltage measurement step to a reference value; a second voltage measurement step that measures a voltage drop between the inspection wiring line and another end of the power supply wiring line; and a second determination step that determines whether or not there is a defect in the light sources disposed between the inspection wiring line and said another end of the power supply wiring line by comparing the voltage drop measured during the second voltage measurement step to a reference value.

In such a configuration, by carrying out the first voltage measurement step and the second voltage measurement step, it is possible to respectively obtain a voltage drop for light sources disposed between the inspection wiring line and the one end of the power supply wiring line that is opposite to the inspection wiring line and a voltage drop between the inspection wiring line and said another end of power supply wiring line that is opposite to the inspection wiring line. In the respective first and second determination steps, the respective voltage drops measured during the first voltage measurement step and the second voltage measurement step are compared to the reference value. It is possible to use, as the reference value, a numerical range from the maximum value to the minimum value of the tolerance of the voltage drop of the light sources disposed between the inspection wiring line and the one end of the power supply wiring line that is opposite to the inspection wiring line and a numerical range from the maximum value to the minimum value of the tolerance of the voltage drop of the light sources disposed between the inspection wiring line and said another end of the power supply wiring line that is opposite to the inspection wiring line, for example. In addition, this numerical range that functions as a reference value is relatively small compared to a numerical range that functions as reference value when all of the light sources are inspected at once using the power supply wiring line. Thus, it is possible to avoid the voltage drop of a single light source falling within this numerical range and increase reliability in detecting defective light sources.

Effects of the Invention

According to the present invention, it is possible to increase reliability in detecting defective light sources.

DETAILED DESCRIPTION OF EMBODIMENTS

Embodiment 1

Figure 1:
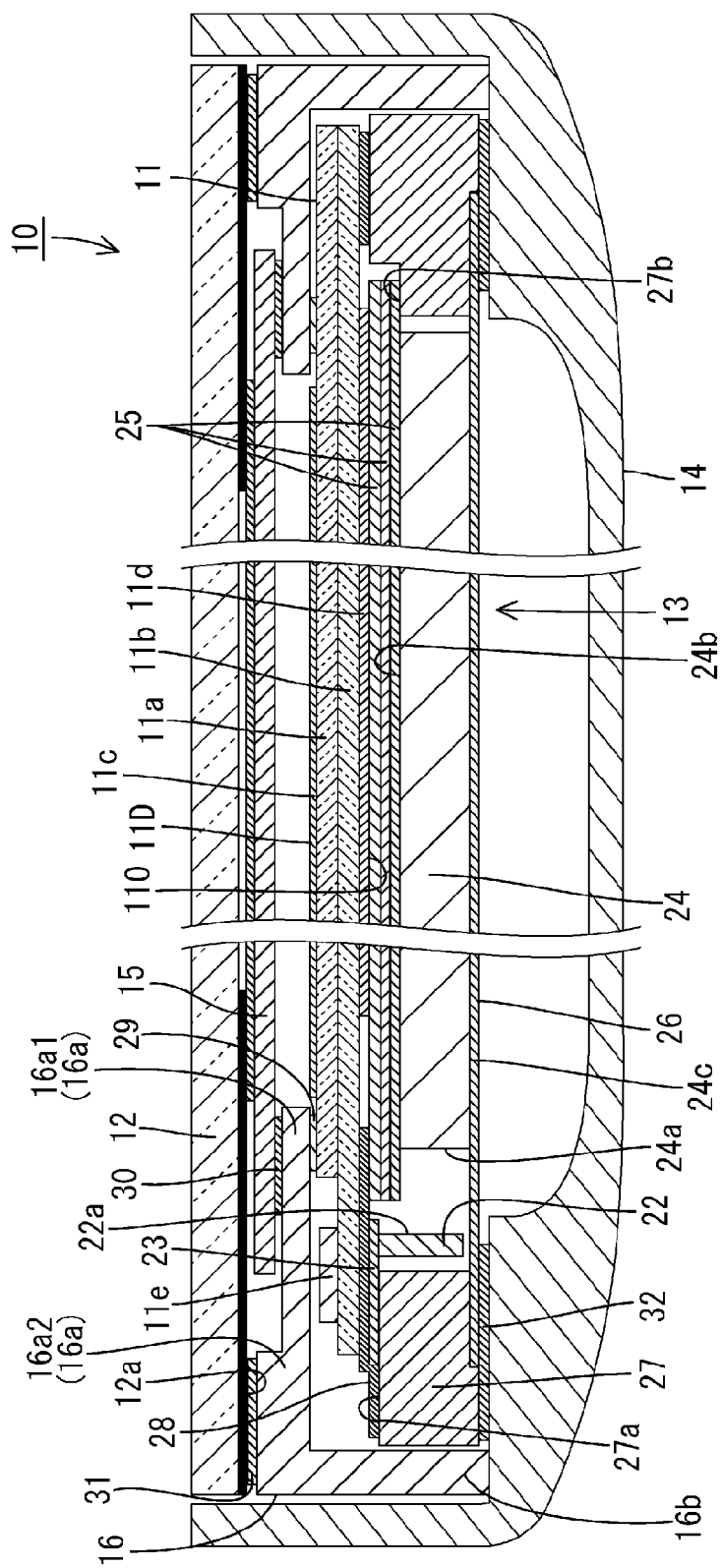
FIG. 1 is a cross-sectional view of a liquid crystal display device according to Embodiment 1 of the present invention.

Embodiment 1 of the present invention will be described with reference to FIGS. 1 to 5. In the present embodiment, a liquid crystal display device (a display device) 10 that includes a liquid crystal panel 11 as a display panel will be described. The drawings indicate an X axis, a Y axis, and a Z axis in a portion of the drawings, and each of the axes indicates the same direction in the respective drawings. The up and down direction in the drawings is based on the up and down direction in FIG. 1. The upper side in FIG. 1 is referred to as the front side while the lower side thereof is referred to as the rear side.

The liquid crystal display device 10 has a rectangular shape as a whole, and, as shown in FIG. 1, includes: a liquid crystal panel (display panel) 11 that has a display surface 11D that displays images and an opposing surface 11O that is opposite to the display surface 11D; a touch panel 15 disposed to the front of the liquid crystal panel 11 so as to face the display surface 11D of the liquid crystal panel 11; a cover panel 12 disposed to the front of the touch panel 15 so as to face the side of the touch panel 15 that is opposite of the liquid crystal panel 11; and a backlight device (illumination device) 13 that is disposed on a side of the liquid crystal panel 11 that is on the side opposite of the backlight 15 so as to face the opposing surface 11O, or in other words, disposed on the rear side of the liquid crystal panel 11, and that is an external light source that provides light to the liquid crystal panel 11. Furthermore, the liquid crystal display device 10 supports the cover panel 12 and the touch panel 15 from the rear side (liquid crystal panel 11 side). The liquid crystal display device 10 further includes: a first panel supporting member 16 that can press on the display panel 11 from the front side (the cover panel 12 and touch panel 15 side); and a casing (housing member, exterior member) 14 that houses the cover panel 12, the touch panel 15, the liquid crystal panel 11, the backlight device 13, and the first panel supporting member 16. Of the components of the liquid crystal display device 10, the cover panel 12 and the casing 14 constitute the exterior of the liquid crystal display device 10. Liquid crystal display devices 10 according to the present embodiment are mainly used in electronic devices such as tablets and laptop computers. The size of the screen may be approximately 7 to 20 inches, for example.

Next, various components of the liquid crystal display device 10 will be explained in order. First, the liquid crystal panel 11 will be described in detail. The liquid crystal panel 11 has a rectangular shape as a whole when viewed in a plan view. As shown in FIG. 1, the liquid crystal panel 11 includes: a pair of glass substrates 11a, 11b that are substantially transparent and have excellent light transmissivity; and a liquid crystal layer (not shown) that is interposed between the pair of substrates 11a, 11b, and that includes liquid crystal molecules made of a substance in which the optical properties change as an electric field is applied. The two substrates 11a, 11b are attached via a sealant (not shown) so as to maintain a gap that corresponds to the width of the liquid crystal layer. The liquid crystal panel 11 has a display region (an active area) where images are displayed, and a non-display region (a non-active area) that has a frame-like shape that surrounds the display region and in which images are not displayed. The short side direction of the liquid crystal panel 11 corresponds to the Y axis direction, the long side direction thereof corresponds to the X axis direction, and the thickness direction thereof corresponds to the Z axis direction.

Of the two substrates 11a, 11b that form the liquid crystal panel 11, the substrate closest to the front of the display device (on the front surface side) is a CF substrate 11a, and the substrate closest to the rear of the display device (on the rear surface side) is an array substrate 11b. The long side dimension of the array substrate 11b is larger than the long side dimension of the CF substrate 11a. One end of the array substrate 11b in the long side direction lines up with the corresponding end of the CF substrate 11a, while the other end of the array substrate 11b in the long side direction protrudes beyond the corresponding end of the CF substrate 11a. A driver (panel driving unit) 11e for driving the liquid crystal panel 11 is mounted on this protruding portion using direct COG (chip-on-glass) mounting. The driver 11e is disposed on the non-display region of the liquid crystal display panel 11. The driver 11e is able to process various input signals provided via a flexible substrate (not shown) and provide these signals to a switching element, which will be explained later, inside the display region. A plurality of TFTs (thin film transistors), which are switching elements, and a plurality of pixel electrodes are arranged in a matrix on the inner surface of the array substrate 11b (the surface that contacts the liquid crystal layer and that faces the CF substrate 11a), and gate wiring lines and source wiring lines are arranged in a grid-like pattern so as to surround these TFTs and pixel electrodes. Prescribed image signals are provided from a control circuit (not shown) to these various wiring lines via the driver 11e. The pixel electrodes, which are disposed in a quadrilaterally-shaped region surrounded by the gate wiring lines and the source wiring lines, are transparent electrodes formed of ITO (indium tin oxide) or ZnO (zinc oxide).

Meanwhile, a plurality of color filters are arranged on the CF substrate 11a in locations corresponding to the respective pixels. The color filters are arranged such that the three colors R, G, and B are alternately disposed. Light-shielding layers (black matrices) are formed between the respective color filters to prevent color mixing. An opposite electrode, which opposes the pixel electrodes on the array substrate 11b, is provided on the respective surfaces of the color filters and the light-shielding layer. The CF substrate 11a is formed so as to be slightly smaller than the array substrate 11b. Alignment films for aligning the liquid crystal molecules included in the liquid crystal layer are respectively formed on the inner surfaces of the substrates 11a, 11b. Polarizing plates 11c, 11d are bonded to the respective outer surfaces of the two substrates 11a and 11b.

Figure 2:
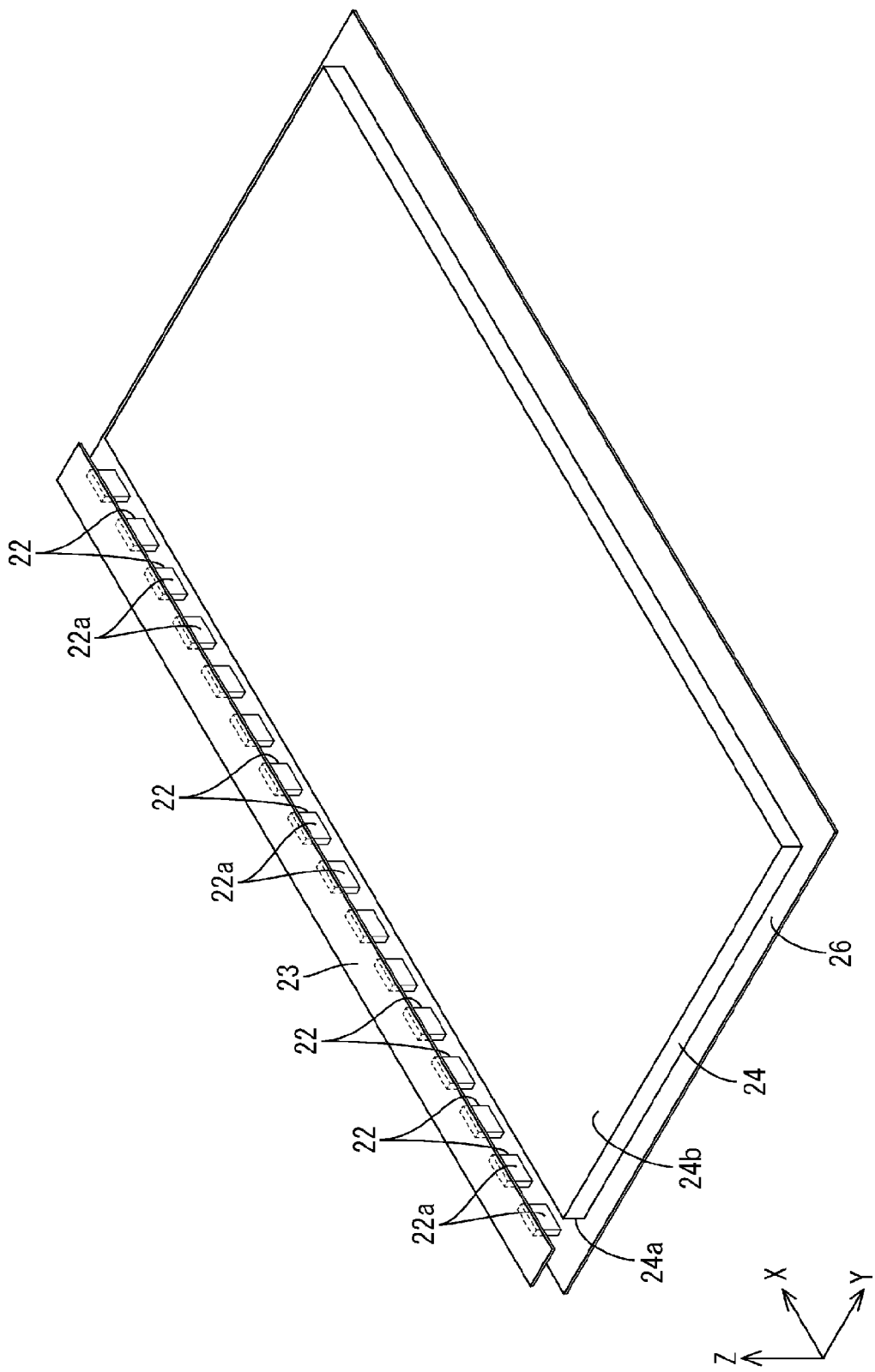
FIG. 2 is an exploded perspective view that shows a schematic configuration of a backlight device included in a liquid crystal display device.

Next, the configuration of the backlight device 13 will be explained in detail. Similar to the liquid crystal panel 11, the backlight device 13 has a substantially rectangular block shape as a whole when viewed in a plan view. As shown in FIGS. 1 and 2, the backlight device 13 includes: LEDs (light emitting diodes) 22 that function as light sources; an LED substrate (light source substrate) 23 on which the LEDs 22 are mounted; a light guide plate 24 that guides light from the LEDs 22; optical sheets (optical members) 25 that are stacked on the front side of the light guide plate 24; a reflective sheet (reflective member) 26 that is disposed to the rear of the light guide plate 24; and a second panel supporting member 27 that surrounds the light guide plate 24 and the optical sheets 25 and supports the liquid crystal panel 11 from the rear side (the side opposite of the cover panel 12). The backlight device 13 is a so-called "edge-lit" (side-lit) backlight device disposed such that the LEDs 22 are disposed beyond the peripheral edges of the liquid crystal panel 11. Next, each constituting component of the backlight device 13 will be explained.

Figure 3:
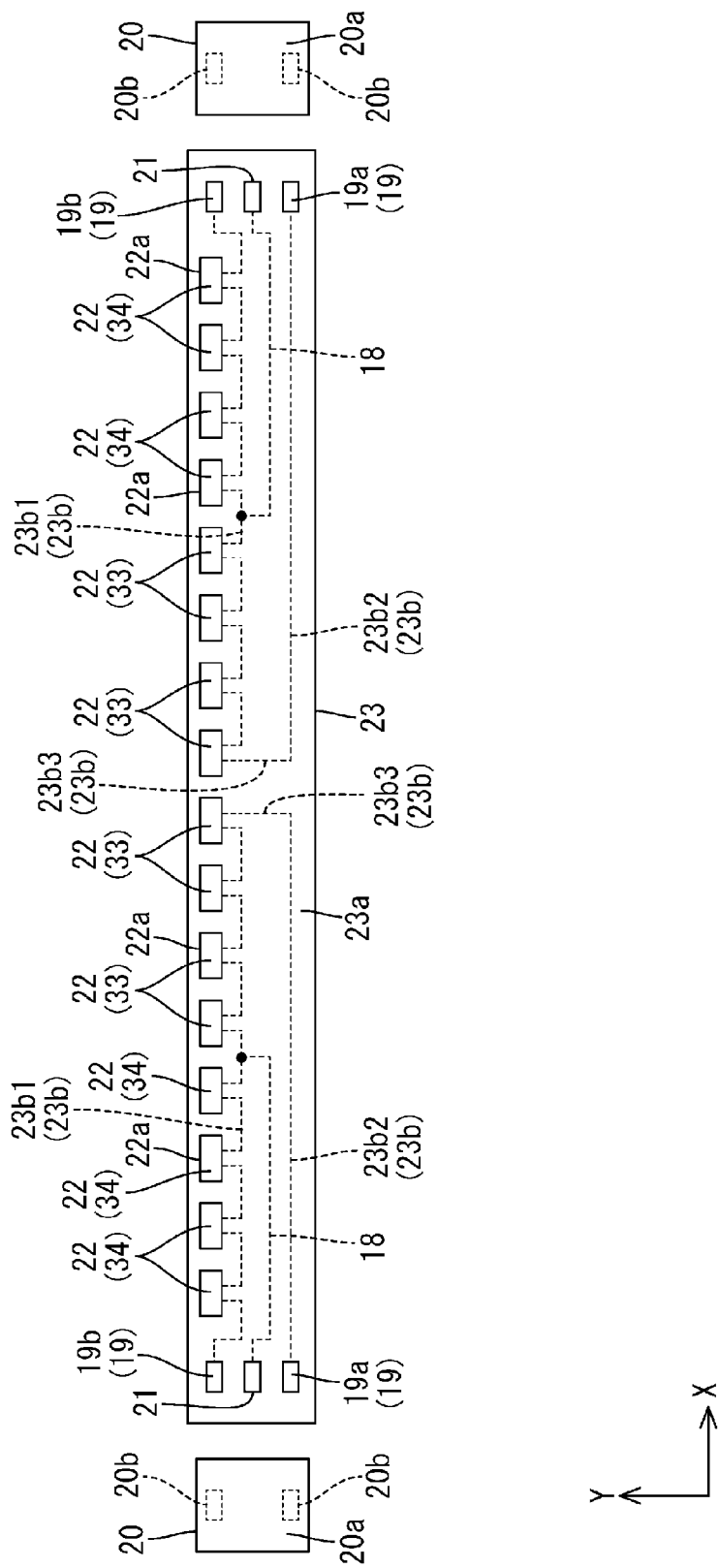
FIG. 3 is a bottom view of an LED substrate and a power supply connector.

As shown in FIGS. 1 to 3, the LEDs 22 have a configuration in which an LED chip (an LED element), which is a semiconductor light-emitting element, is sealed via a resin on a substrate section that is affixed to a surface of the LED substrate 23. The LED chip mounted on the substrate section has one type of primary light-emitting wavelength, and specifically, only emits blue light. On the other hand, the resin that seals the LED chip has a phosphor material dispersed therein, the phosphor material emitting light of a prescribed color by being excited by the blue light emitted from the LED chip. This combination of the LED chip and the phosphor material emits light that has an overall white color. The LEDs 22 have an anode terminal (not shown) and a cathode terminal (not shown). The LED chip produces light as a result of a forward bias direct current flowing between these two terminals. LEDs 22 are designed and manufactured so that voltage drops that occur when current flows are equal to a prescribed reference value. In LEDs 22 that have been actually manufactured, however, there may be individual variability in the voltage drops, with this variability falling within the tolerance range (the range from the maximum value to the minimum value of the tolerance) for voltage drops of the LEDs 22. The LEDs 22 are of a so-called side-emitting type in which the side adjacent to that mounted onto the LED substrate 23 is a light-emitting surface 22a. The LEDs 22 are light sources that provide light to the liquid crystal panel 11 in the liquid crystal display device 10; thus, these LEDs 23 are brighter than LEDs used in photograph processing devices (film scanners) or the like, for example. As a result, the tolerance range for voltage drops in the LEDs 22 tends to be larger than that for LEDs used in photograph processing devices and the like.

As shown in FIGS. 1 to 3, the LED substrate 23 has a film-shaped (sheet-shaped) substrate section (base material) 23a that is made of an insulating material and that is flexible. The LEDs 22 are surface mounted on the substrate section 23a and a power supply wiring line 23b for supplying power to the LEDs 22 is formed by patterning. The LED substrate 23 is disposed only on one end in the long-side direction of the backlight device 13, and extends along the long-side direction (X axis direction) of the backlight device 13. On the substrate section 23a of the LED substrate 23, LEDs 22 are mounted in plurality (a total of 16 in FIG. 3) in a line along the extending direction (the X axis direction) with gaps therebetween. Adjacent LEDs 22 are connected to each other in series via the power supply wiring line 23b. Two power supply wiring line 23b systems are formed on the substrate section 23a of the LED substrate 23 of the present embodiment. In each of these systems, half of the 16 total LEDs 22, or in other words, eight LEDs, are connected. The array pitch between adjacent LEDs 22 is substantially uniform. In other words, the respective LEDs 22 are arranged in the X axis direction with substantially equal gaps therebetween. The LED substrate 23 is disposed so as to be sandwiched between the liquid crystal panel 11 and the second panel supporting member 27, which will be explained later, in the thickness direction (Z axis direction) of the backlight device 13. Therefore, the mounting surface for the LEDs 22 (the surface on which the power supply wiring line 23b is formed) on the substrate section 23a of the LED substrate 23 faces toward the rear (the side opposite of the liquid crystal panel 11) of the display device. The wiring route and the like of the power supply wiring line 23b on the substrate section 23a will be explained in more detail later.

The light guide plate 24 has a rectangular shape when viewed in a plan view. As shown in FIGS. 1 and 2, the surfaces of the light guide plate 24 are parallel to the surfaces of the liquid crystal panel 11, and of the peripheral end faces of the light guide plate 24, the left side end face in the long side direction shown in FIG. 1 faces the LEDs 22 and is a light-receiving face (light source-facing end face) 24a that receives light from the LEDs 22. The surface of the light guide plate 24 that faces toward the front (toward the liquid crystal panel 11) is a light-exiting surface 24b where light is emitted toward the liquid crystal panel 11. In addition, among the peripheral edge faces of the light guide plate 24, the three end faces other than the light-receiving face 24a (specifically, the right side end face in the long side direction and the pair of end faces in the short side direction in FIG. 1) are respectively non-LED-facing end faces (non-light source-facing end faces) that do not face the LEDs 22.

As shown in FIG. 1, the optical sheets 25 are stacked on the front side of the light-exiting surface 24b of the light guide plate 24 and are interposed between the liquid crystal panel 11 and the light guide plate 24. Thus, light emitted from the light guide plate 24 passes through the optical sheets 25, and the optical sheets 25 apply prescribed optical effects on the light, after which the light is emitted toward the liquid crystal panel 11. The optical sheets 25 are stacked in plurality upon each other (three sheets total in the present embodiment). The optical sheets 25 have a rectangular shape similar to that of the light guide plate 24 when seen in a plan view. The long-side dimension and the short-side dimension of the optical sheets 25 are larger than the corresponding dimensions of the light guide plate 24, and are smaller than the corresponding dimensions of the array substrate 11b in the liquid crystal panel 11. Specific examples of sheets that can be used as the optical sheets 25 include diffusion sheets, lens sheets, reflective polarizing sheets, and the like, for example. It is possible to appropriately select and use any of the above-mentioned sheets as the optical sheets 25.

As shown in FIGS. 1 and 2, the reflective sheet 26 is disposed so as to cover a rear surface (a surface on the side opposite of the light-exiting surface 24b) 24c of the light guide plate 24. The reflective sheet 26 is made of a white synthetic resin sheet material of which the surface has excellent reflectivity; thus, light propagating inside the light guide plate 24 can be efficiently directed toward the front (toward the light-exiting surface 24b). The reflective sheet 26 has a rectangular shape similar to that of the light guide plate 24 when seen in a plan view. The long-side dimension and the short-side dimension of the reflective sheet 26 are longer than the corresponding dimensions of the light guide plate 24, and are approximately equal to or larger than the corresponding dimensions of the array substrate 11b in the liquid crystal panel 11. The reflective sheet 26 substantially overlaps the entire liquid crystal panel 11 in a plan view, and also overlaps an inner edge portion of the second panel supporting member 27, which will be explained later, in a plan view.

The second panel supporting member 27 is made of a synthetic resin. As shown in FIG. 1, the second panel supporting member 27 has a substantially rectangular frame-like shape in which the outer shape is substantially the same as that of the cover panel 12, and the liquid crystal panel 11, the light guide plate 24, and the optical sheets 25 are housed inside the second panel supporting member 27. The second panel supporting member 27 is formed of four connected parts: a pair of long side portions that extend along the X axis direction, and a pair of short-side portions that extend along the Y axis direction. In cross section, the second panel supporting member 27 has a substantially step-like shape formed of two steps. A first step section 27a, which is relatively tall, supports the peripheral edges in the non-display region of the liquid crystal panel 11 from the rear, and a second step section 27b, which is relatively short, supports the peripheral edges of the optical sheets 25 from the rear. Panel adhesive tape (a panel adhesive member) 28 is disposed so as to be interposed between the first step section 27a of the second panel supporting member 27 and the liquid crystal panel 11 and adheres to both the first step section 27a and the liquid crystal panel 11. Almost all of the respective peripheries of the liquid crystal panel 11 and the second panel supporting member 27 are attached and fixed to each other via the panel adhesive tape 28. The panel adhesive tape 28 contains a flexible tape-like base material with an adhesive applied to both the front and rear surfaces thereof. The panel adhesive tape is formed in a substantially rectangular frame-like shape as a whole to match the shape of the second panel supporting member 27, to which the tape will be attached. The first step section 27a is provided in the long-side portion of the second panel supporting member 27 that faces the LEDs 22. The second step section 27b is not provided in this portion of the second panel supporting member 27, and the LED substrate 23 is stacked upon the first step section 27a. The LED substrate 23 is sandwiched between the first step section 27a of the second panel supporting member 27 and the edge of the array substrate 11b of the liquid crystal panel 11.

The first panel supporting member 16, which sandwiches the liquid crystal display panel 11 between the first panel supporting member 16 and the second panel supporting member 27 and which supports the cover panel 12 and the touch panel 15 from the rear, will be explained next. The first panel supporting member 16 is formed of a synthetic resin, for example. As shown in FIG. 1, the first panel supporting member 16 is formed of a frame section (a support base) 16a that extends so as to correspond to the respective peripheral edges (periphery portions) of the liquid crystal panel 11, the cover panel 12, and the touch panel 15, and that has a substantially rectangular grid-like shape when seen in a plan view; and a loop section (cylindrical section) 16b that is connected to the peripheral edges of the frame section 16a and that respectively surrounds the liquid crystal panel 11 and the second panel supporting member 27 (the backlight device 13) from the periphery. The frame section 16a that forms a part of the first panel supporting member 16 has a surface that extends along respective plate surfaces (in the X axis direction and the Y axis direction) of the liquid crystal panel 11, the cover panel 12, and the touch panel 15. This surface faces the respective surfaces of the liquid crystal panel 11, the cover panel 12, and the touch panel 15. The frame section 16a supports the liquid crystal panel 11 by pressing on the peripheral edges of the outer surface (the surface of the display surface 11D) of the liquid crystal panel 11 from the front and by sandwiching the liquid crystal panel 11 between the second panel supporting member 27, which forms a part of the backlight device 13, and the frame section 16a. In contrast, the frame section 16a receives from the rear the respective inner surfaces (the surfaces facing the liquid crystal panel 11) of the respective peripheral edges of the cover panel 12 and the touch panel 15. A portion of the frame section 16a (an inner portion 16a1, which will be explained later) is disposed so as to be interposed between respective peripheral edges of the liquid crystal panel 11 and the touch panel 15. In this way, a prescribed gap is ensured to exist between the liquid crystal panel 11 and the touch panel 15. Thus, even if the cover panel 12 and touch panel 15 deform so as to bend toward the liquid crystal panel 11 when an external force is applied to the cover panel 12, for example, it is unlikely that the bent touch panel 15 will interfere with the liquid crystal panel 11. Specifically, an outer portion 16a2 of the frame section 16a is relatively thick compared to the inner portion 16a1. Thus, a gap is formed at the boundary of the inner portion 16a1 and the outer portion 16a2. The inner portion 16a1 of the frame section 16a is interposed between the peripheral edges of the liquid crystal panel 11 and the peripheral edges of the touch panel 15, while the outer portion 16a2 receives the peripheral edges of the cover panel 12 from the rear. In addition, a cushioning material 29, which cushions and presses upon the peripheral edges of the liquid crystal panel 11 from the front, is fixed to the rear surface of the inner portion 16a1 of the frame section 16a, while a first fixing member 30, which cushions and fixes the peripheral edges of the touch panel 15, is fixed to the front surface of the inner portion 16a1. The cushioning material 29 and the first fixing member 30 are disposed in respective locations of the inner portion 16a1 so as to overlap each other in a plan view. Meanwhile, a second fixing member 31, which cushions and fixes the peripheral edges of the cover panel 12, is fixed to the front surface of the outer portion 16a2 of the frame section 16a. The cushioning member 29 and the fixing members 30, 31 are disposed so as to respectively extend along the respective sides of the frame section 16a. In addition, the fixing members 30, 31 are formed of double-sided tape that has a base material that provides cushioning, for example. Meanwhile, the loop section 16b has a rectangular short square cylinder shape as a whole when seen in a plan view. The loop section 16b is disposed so as to protrude toward the rear from the periphery of the outer portion 16a2 of the frame section 16a. The loop section 16b surrounds the liquid crystal panel 11 and the second panel supporting member 27 along almost the entire respective outer peripheries thereof from the outside.

The touch panel 15, which is supported from the rear by the second panel supporting member 27, will be explained next. As shown in FIG. 1, the touch panel 15 is a position input device that allows a user to input position information on the plane of the display surface 11D of the liquid crystal panel 11. The touch panel 15 has a rectangular shape, and within the touch panel 15, a prescribed touch panel pattern (not shown) is formed on a glass substrate that is substantially transparent and has excellent light transmissivity.

Specifically, the touch panel 15 includes the glass substrate, which has a rectangular shape similar to that of the liquid crystal panel 11 when seen in a plan view. Transparent electrodes (not shown) for the touch panel, which form a so-called projection-type capacitive touch panel pattern, are formed on the surface of the glass substrate facing toward the front of the touch panel 15. The touch panel transparent electrodes are arranged in a matrix on the surface of the glass substrate. A terminal (not shown), which is connected to an end of wiring drawn out from the touch panel transparent electrodes that form the touch panel pattern, is formed on one short side end of the touch panel 15. Potential is provided from a touch panel drive circuit substrate to the touch panel electrodes that form the touch panel pattern as a result of a flexible substrate (not shown) being connected to the terminal. The inner surface of the peripheral edges of the touch panel 15 is fixed via the first fixing member 30 so as to face the inner portion 16a1 of the frame section 16a of the first panel supporting member 16.

The cover panel 12, which is supported from the rear by the second panel supporting member 27, will be explained next. As shown in FIG. 1, the cover panel 12 is disposed so as to cover nearly the entire respective fronts of the liquid crystal panel 11 and the touch panel 15. As a result, the cover panel is able to protect the liquid crystal panel 11 and the touch panel 15. The cover panel 12 covers the entire front of the frame section 16a of the first panel supporting member 16 and forms the front exterior of the liquid crystal display device 10. The cover panel 12 is formed of plate-like base material made of glass that is substantially transparent and has excellent light transmissivity. It is preferable that tempered glass be used in cover panel 12. It is preferable that the tempered glass used for the cover panel 12 be a chemically-strengthened glass that includes a chemically-strengthened layer on the surface thereof formed by performing a type of chemical strengthening treatment on the surface of the plate-shaped glass base material, for example. This chemical strengthening treatment uses ion exchange to strengthen the plate-shaped glass base material by substituting an alkali metal ion contained in the glass material, for example, with an alkali metal ion that has a larger ion radius. The chemically strengthened layer resulting from this treatment is a compressive strength layer (ion exchange layer) that has residual compressive stress. As a result, the cover panel 12 has high mechanical strength and shock resistance, thereby more reliably preventing damage or scratches on the touch panel 15 and the liquid crystal panel 11 provided to the rear thereof.

The cover panel 12 has a rectangular shape similar to that of the liquid crystal panel 11 when seen in a plan view. As shown in FIG. 1, the cover panel 12 is slightly larger than the liquid crystal panel 11 and the touch panel 15 when seen in a plan view. Therefore, the cover panel 12 has an outer portion that protrudes outward in an eave shape from the peripheral edges of the liquid crystal panel 11. A light-shielding section 12a is formed on the cover panel 12. The light-shielding section 12a is disposed so as to surround the display region of the liquid crystal panel 11 and overlap the non-display region when seen in a plan view. The light-shielding section 12a blocks light at the periphery of the display region. The light-shielding section 12a is made of a light-shielding material such as a black coating, for example, and this light-shielding material is printed onto the rear surface of the cover panel 12, or in other words, the surface facing the liquid crystal panel 11, and is thus integrally formed with this surface. The light-shielding section 12a can block visible light at a minimum. When a light-shielding section 12a is provided, printing methods such as screen printing, ink-jet printing, or the like can be used, for example. The light-shielding section 12a is formed on the portion of the cover panel 12 that overlaps the entire non-display region of the liquid crystal panel 11 and the outer portion of the cover panel 12 that protrudes beyond the peripheral edges of the liquid crystal panel 11, or in other words, nearly the entire portion of the cover panel 12 to the outside of the display region. Thus, the light-shielding section is formed in a substantially vertically long frame-like shape when seen in a plan view, and as a result, light from the backlight device 13 can be blocked by the light-shielding section 12a at the periphery of the display region before the light reaches the rear surface of the cover panel 12. In other words, the light-shielding section 12a is formed on nearly the entire portion of the cover panel 12 that does not overlap the display region of the liquid crystal panel 11 when seen in a plan view.

Next, the casing 14 will be described. The casing 14 is formed of a synthetic resin material or a metal material. As shown in FIG. 1, the casing has a substantially bowl-shaped structure that opens toward the front of the display device. The cover panel 12, the touch panel 15, the liquid crystal panel 11, and the backlight device 13 are completely housed in a housing space inside the casing 14. Therefore, the casing 14 covers the backlight device 13 from the rear and covers the entire sides of the backlight device 13 and the cover panel 12; thus, the casing 14 forms the back exterior and the side exterior of the liquid crystal display device 10. Casing adhesive tape (a housing adhesive member) 32 is disposed so as to be interposed between the portion of the casing 14 that faces the second panel supporting member 27 that forms a portion of the backlight device 13 and the rear surface of the second panel supporting member 27. The adhesive tape bonds the above-mentioned portion of the casing 14 to the second panel supporting member 27. Thus, the casing 14 is kept attached to the second panel supporting member 27 via the casing adhesive tape 32. The casing adhesive tape 32 is formed in a roughly rectangular frame-like shape as a whole so as to match the shape of the second panel supporting member 27 to which the tape 32 will be attached. Thus, the casing 14 and the second panel supporting member 27 are fixed to each other along nearly the entire respective peripheries thereof. A portion of the casing adhesive tape 32 is attached to the peripheral edges of the reflective sheet 26. In addition, the casing adhesive tape 32 has a flexible tape-like base material, and an adhesive is applied to the front and rear surfaces of the base material. Thus, the casing adhesive tape 32 is identical to the panel adhesive tape 28 mentioned above. In addition, various types of substrates, such as a control substrate for controlling the driving of the liquid crystal panel 11 and an LED driving substrate for providing driving power to the LEDs 22, that are not shown in the drawings are housed in a space to the rear of the backlight device 13 in the housing space of the casing 14.

A lighting test can be conducted on the LEDs 22 in the liquid crystal device 10 having the above-mentioned configuration during various steps in the manufacturing process, such as when assembly of the backlight device 13 has been completed or when assembly of the liquid crystal display device 10 has been completed. At such time, the person conducting the light test confirms whether or not the LEDs 22 are working by observing the light generated by the LEDs 22. Since this light passes through at least the light guide plate 24 and the optical sheets 25 before reaching the eyes of the person, it is possible that the person will not notice defective LEDs 22 that are not lit, which will lead to incorrect test results. Thus, it is possible, in place of or in concert with the above-mentioned lighting test, to measure voltage drops between both ends of the power supply wiring line 23b on the LED substrate 23 and detect whether or not there are any defective LEDs 22 in accordance with whether or not the measured value equals a reference value. However, since there may be individual variability that falls within the tolerance range of voltage drops of the LEDs 22 as a result of production issues, it is possible that the voltage drop tolerance range for all of the LEDs 22 may be larger than the voltage drop of a single LED 22 if all of the LEDs 22 connected to the power supply wiring line 23b are inspected at the same time by measuring voltage drops between both ends of the power supply wiring line 23b. In such a case, there is the possibility that defective LEDs 22 will not be detected. In particular, LEDs 22 used as light sources in backlight devices 13 included in liquid crystal display devices 10 such as those of the present invention are generally much brighter than LEDs used in photograph processing devices, for example. Thus, the tolerance of LEDs 22 used in such backlight devices 13 tends to be higher. As a result, when all of the LEDs 22 connected to the power supply wiring line 23b are inspected at the same time, there is a higher likelihood that defective LEDs 22 will not be detected, which is a cause for concern.

Figure 5:
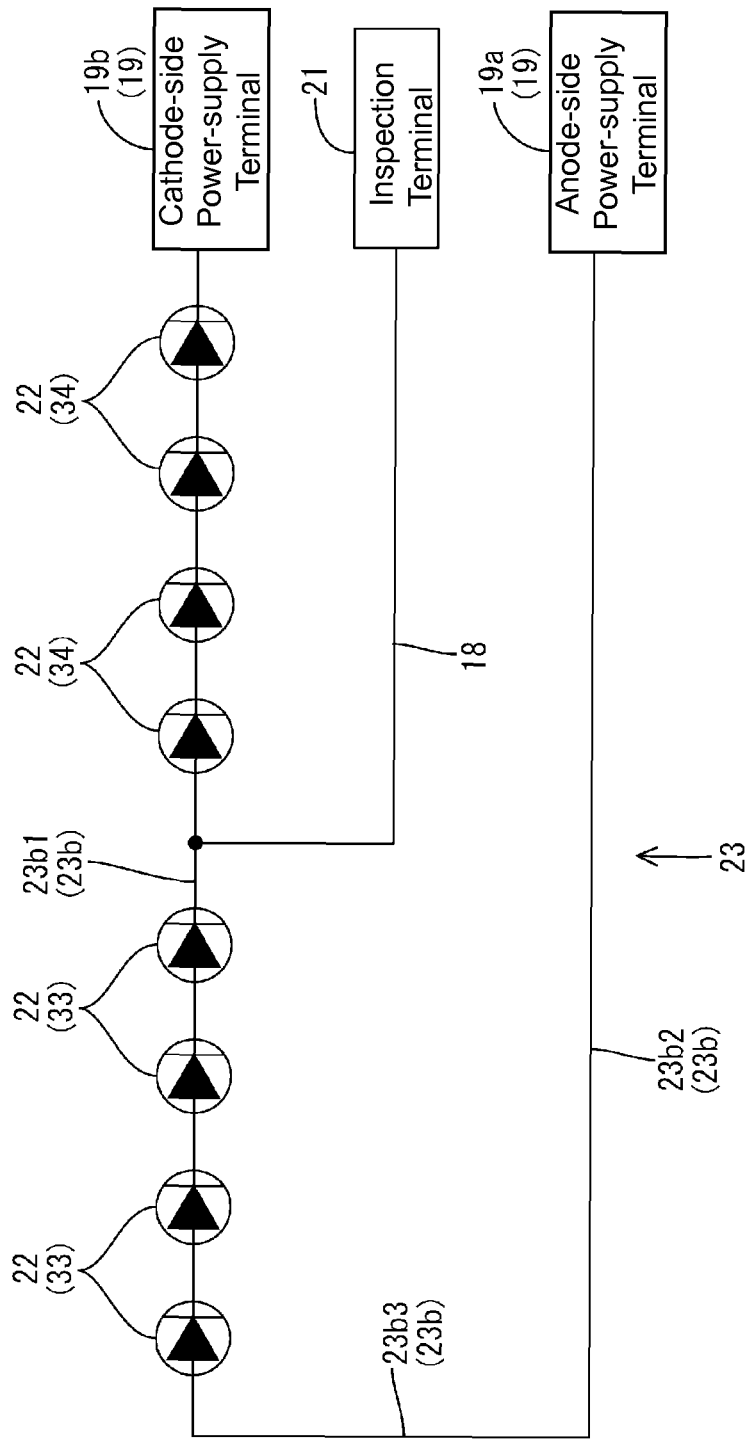
FIG. 5 is a circuit diagram that illustrates an electrical connection configuration of LEDs in an LED substrate.

Therefore, as shown in FIGS. 3 and 5, the inspection wiring line 18, which is connected to the portion of the power supply wiring line 23b that connects a pair of adjacent LEDs 22, is formed on the substrate section 23a that forms a part of the LED substrate 23 of the present embodiment. As a result, it is possible to divide an array of LEDs 22, which is connected to the power supply wiring line 23b, into two groups and measure voltage drops that occur in the respective groups. By so doing, it is possible to avoid having the voltage drop of a single LED 22 fall within the voltage drop tolerance range of the respective groups and to detect defective LEDs 22 with a high degree of reliability. Hereafter, the power supply wiring line 23b will be explained in more detail, after which the inspection wiring line 18 will be explained in detail.

As shown in FIG. 3, the power supply wiring line 23b is formed on the surface of the substrate section 23a of the LED substrate 23 along the long side direction (the length direction, the direction in which the plurality of LEDs 22 are aligned) thereof. In addition, the power supply wiring line 23b has a cuff-like shape as a whole and is disposed such that both ends are disposed closer to one end of the substrate section 23a in the long side direction thereof. As mentioned above, two power supply wiring line 23b systems are formed on the substrate section 23a. Both ends of one of the power supply wiring lines 23b are disposed to one end of the substrate section 23a in the long side direction thereof, while both ends of the other power supply wiring line 23b are disposed to the other end of the substrate section 23a in the long side direction thereof. Return portions 23b3 of the respective power supply wiring lines 23b are disposed back-to-back in the center of the substrate section 23a in the long side direction thereof. These two power supply wiring lines 23b respectively connect eight LEDs 22 in series, and are disposed symmetrically when seen in a plan view. Power supply terminals 19, which are respectively connected to one end of the respective power supply wiring lines 23b, are respectively formed on both ends of the substrate section 23a in the long side direction thereof. The power supply terminals 19 are respectively formed of an anode-side power supply terminal 19a that is connected to an anode-side end of the power supply wiring line 23b, and a cathode-side power supply terminal 19b that is connected to a cathode-side end of the power supply wiring line 23b. The power supply terminals 19 are disposed on the substrate section 23a so as to match the number of power supply wiring line 23b systems, which in this case is two. Power supply connectors 20, which are connected to the LED driving substrate (light source driving circuit) via a wiring member (not shown) and which can supply power to light the LEDs 22, are attached to the ends of the substrate section 23a in the long side direction thereof so as to be removable. The power supply connectors 20 are formed of an insulating power supply housing 20a, and a conductive power supply terminal clamp 20b that is housing within the power supply housing 20a. The power supply housing 20a is made of a synthetic resin, and can support the end of the substrate section 23a in the long side direction by sandwiching the end from the front and rear. A pair of power supply terminal clamps 20b made of metal are provided to correspond to the anode-side power supply terminal 19a and the cathode-side power supply terminal 19b. The power supply terminal clamps 20b are elastic so as to be able to respectively contact the terminals 19a, 19b.

The wiring route of the power supply wiring line 23b will be explained in detail next. As shown in FIGS. 3 and 5, the power supply wiring line 23b has a first extension section 23b1 that extends along the long side direction of the substrate section 23a from the end connected to the cathode-side power supply terminal 19b to the return portion 23b3. The first extension section 23b1 passes through each of the LEDs 22 and is connected to the anode terminal and cathode terminal of each of the LEDs 22. Therefore, the first extension section 23b1 is formed of: a portion that connects the cathode-side power supply terminal 19b to the cathode terminal of the LED 22 closest to the cathode-side power supply terminal 19b; portions that respectively connect the anode terminal of one of two LEDs 22 adjacent in the X axis direction to the cathode terminal of the other of the two LEDs 22; and a portion that connects the return portion 23b3 to the anode terminal of the LED 22 closest to the return portion 23b3. The first extension section 23b1 contains seven portions, in other words one less than the number of LEDs 22 connected by the power supply wiring line 23b, that connect an anode terminal of one of the LEDs 22 with a cathode terminal of another of the LEDs 22 that is adjacent in the X axis direction. Meanwhile, the power supply wiring line 23b also contains a second extension section 23b2 that extends along the long side direction of the substrate section 23a from the end connected to the anode-side power supply terminal 19a to the return portion 23b3. This second section extension 23b2 does not pass through the LEDs 22 and is disposed so as to extend in a substantially straight line and to be connected to the anode-side power supply terminal 19a and the return portion 23b3. Almost all of the power supply wiring line 23b, except for the power supply terminals 19, is covered by an insulating layer (a resist; not shown); thus, the power supply wiring line 23b is prevented from protruding toward the exterior.

Next, the inspection wiring line 18 will be explained in more detail. As shown in FIG. 3, the inspection wiring line 18 is formed on the front surface of the substrate section 23a, or in other words, the mounting surface (the formation surface of the power supply wiring line 23b) of the LEDs 22. The inspection wiring line 18 is disposed so as to be sandwiched between the first extension section 23b1 and the second extension section 23b2 of the power supply wiring line 23b. The inspection wiring line 18 has the same number of systems as the power supply wiring line 23b on the substrate 23a, or in other words, two systems. These systems are respectively connected to a different power supply wiring line 23b. The inspection wiring line 18 is disposed so as to extend along the X axis direction in parallel to the first extension section 23b1 and the second extension section 23b2. One end of the inspection wiring line 18 is connected to the first extension section 23b1 and the other end of the inspection wiring line 18 is connected to the inspection terminal 21. The total number of inspection terminals 21 is the same as the number of power supply wiring line 23b systems (the number of inspection wiring lines 18) on the substrate section 23a, which in this case is two. These respective inspection terminals 21 are disposed at both ends of the substrate section 23a in the long side direction. The inspection terminals 21 are disposed in the X axis direction in a manner substantially identical to that of the power supply terminals 19 and are disposed so as to be sandwiched in the Y axis direction between the anode-side power supply terminal 19a and the cathode-side power supply terminal 19b that make up the power supply terminals 19. In other words, the inspection terminals 21 and the power supply terminals 19 are disposed so as to be adjacent and to be arranged along the Y axis direction (a direction along the surface of the substrate section 23a that is orthogonal to the arrangement direction of the LEDs 22). Similar to the power supply wiring line 23b, almost all of the inspection wiring line 18, except for the inspection terminals 21, is covered by an insulating layer (resist; not shown), and is thus prevented from protruding to the exterior.

Meanwhile, as shown in FIGS. 3 and 5, the length dimension (extension length) of the inspection wiring line 18 is roughly half of the respective length dimensions of the first extension section 23b1 and the second extension section 23b2. Thus, the location where one end of the inspection wiring line 18 connects to the first extension section 23b1 is substantially centrally located along the length dimension (extension direction) of the first extension section 23b1. In other words, the one end of the inspection wiring line 18 connects to the power supply wiring line 23b in a location such that the array of eight LEDs 22 connected to the power supply wiring line 23b is divided in half. Specifically, the inspection wiring line 18 is connected to a portion of the first extension section 23b1 that connects, from among a pair of adjacent LEDs 22 that are disposed in the center of the array of eight LEDs 22 in the alignment direction (X-axis direction), an anode terminal of one of the LEDs 22 and the cathode terminal of the other LED 22. Therefore, an array of four LEDs 22 (hereafter referred to as a first LED array (first light source array) 33) is disposed between the inspection wiring line 18 and the anode side terminal (anode-side power supply terminal 19a) of the power supply wiring line 23b, and another array of four LEDs 22 (hereafter referred to as a second LED array (second light source array) 34) is disposed between the inspection wiring line 18 and the cathode side terminal (cathode-side power supply terminal 19b) of the power supply wiring line 23b. In this way, voltage drops are measured between the inspection terminal 21 connected to another end of the inspection wiring line 18 and the anode-side power supply terminal 19a connected to the anode side of the power supply wiring line 23b; thus, it is possible to measure voltage drops in the first LED array 33 that consists of four LEDs 22 disposed between the two terminals 19a, 21. Similarly, by measuring voltage drops between the inspection terminal 21 connected to the one end of the inspection wiring line 18 and the cathode-side power supply terminal 19b connected to the cathode side of the power supply wiring line 23b, it is possible to measure voltage drops in the second LED array 34 that consists of four LEDs 22 disposed between the two terminals 19b, 21. In this way, it is possible to use the inspection wiring line 18 and the inspection terminal 21 to divide the entire LED array 22 connected to the power supply wiring line 23b into two groups and then measure respective voltage drops within the two groups of LEDs 22.

Figure 4:
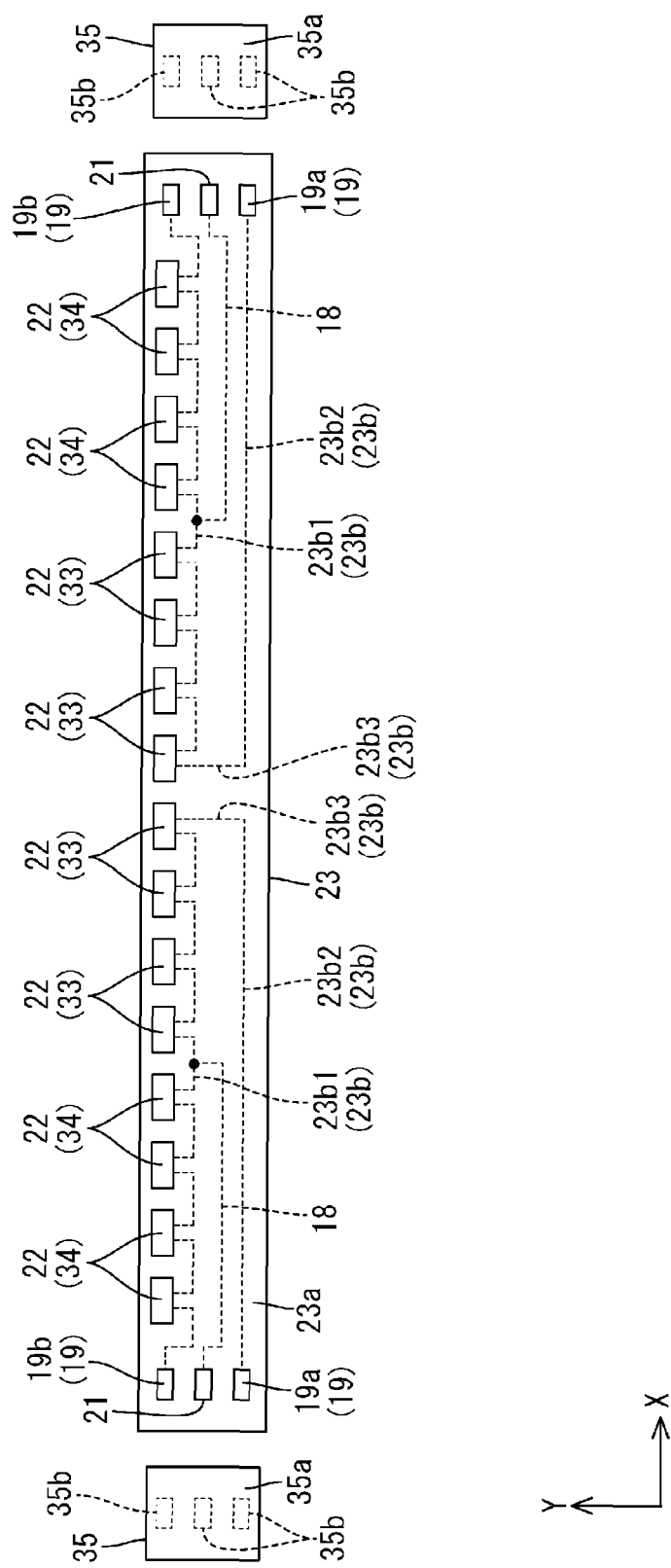
FIG. 4 is a bottom view of an LED substrate and an inspection connector.

Since the above-mentioned light test will be conducted, inspection connectors 35, which are connected to an inspection device via a wiring member (not shown), are attached to the ends of the substrate section 23a of the LED substrate 23 in the long side direction thereof so as to be removable. As shown in FIG. 4, the inspection connectors 35 are respectively made up of an insulating inspection housing 35a and a conductive inspection terminal clamp 35b, which is housed inside the inspection housing 35a. The inspection housing 35a is made of a synthetic resin and is able to support the ends of the substrate section 23a in the long side direction thereof by sandwiching the ends from the front and the rear. There are three metal inspection terminal clamps 35b, which respectively correspond to the inspection terminal 21 and the anode-side power supply terminal 19a and the cathode-side power supply terminal 19b that make up the power supply terminals 19. The inspection terminal clamps 35b are flexible so as to be able to contact the respective terminals 19a, 19b, 21. Except for the fact that there are three inspection terminal clamps 35b, the inspection connectors 35 have substantially the same structure as the power supply connectors 20. Thus, the inspection connectors 35 are connected to the substrate section 23a in a manner identical to the method used for the power supply connectors 20.

Next, the method of dividing the LED 22 array on the substrate section 23a into groups will be explained in more detail. In the present embodiment, the inspection wiring line 18 is connected to the power supply wiring line 23b such that $\Delta$Vfg is less than Vfmax ($\Delta$Vfg<Vfmax), where $\Delta$Vfg is the difference between the maximum value and the minimum value of the tolerance for voltage drops measured between the inspection wiring line 18 and the end (anode-side power supply terminal 19a) on the anode side of the power supply wiring line 23b that is opposite to the inspection wiring line 18 or the end on the cathode side (cathode-side power supply terminal 19b) that is opposite to the inspection wiring line 18, and Vfmax is the maximum value of the tolerance for voltage drops of a single LED 22. As a result, voltage drops for a single LED 22 can be prevented from falling within the tolerance range for voltage drops for the entire first LED array 33 or the entire second LED array 34, which are LED 22 groups disposed between the inspection wiring line 18 and the end on the anode side of the power supply wiring line 23b opposite to the inspection wiring line 18 or the end on the cathode side of the power supply wiring line 23b that is opposite to the inspection wiring line 18. Thus, defective light sources can be more reliably detected.

In other words, in the present embodiment, the inspection wiring line 18 is connected to the power supply wiring line 23b such that n1 and n2 respectively satisfy the formulas (2) and (3) shown below when "n" satisfies the conditions of formula (1) shown below, where $\Delta$Vf is the difference between the maximum value and the minimum value for voltage drops of a single LED 22, Vfmax is the maximum value of the tolerance for voltage drops of a single LED 22, "n" is the total number of LEDs 22 connected to one power supply wiring line 23b, n1 is the number of LEDs 22 forming the first LED array 33 disposed between the inspection wiring line 18 and the anode-side end of the power supply wiring line 23b that is opposite to the inspection wiring line 18, and n2 is the number of LEDs 22 forming the second LED array 34 disposed between the inspection wiring line 18 and the cathode-side end of the power supply wiring line 23b that is opposite to the inspection wiring line 18. As shown by formula (1), when "n," which is the total number of LEDs 22 connected to one power supply wiring line 23b, is larger than the value of Vfmax/ΔVf, the voltage drop of a single LED 22 will fall within the tolerance range for voltage drops of all of the LEDs 22 as a whole when all of the LEDs 22 connected to the power supply wiring line 23b are inspected at the same time using the power supply wiring line 23b. Thus, it is possible that defective LEDs 22 will not be detected. As indicated by formulas (2) and (3), a countermeasure is to connect the inspection wiring line 18 to the power supply wiring line 23b such that n1, which is the total number of LEDs 22 in the first LED array 33 disposed between the inspection wiring line 18 and the anode-side end of the power supply wiring line 23b that is opposite to the inspection wiring line 18, and n2, which is the number of LEDs 22 in the second LED array 34 disposed between the inspection wiring line 18 and the cathode-side end of the power supply wiring line 23b that is opposite to the inspection wiring line 18, are respectively less than the value of Vfmax/ΔVf. As a result, the voltage drop of a single LED 22 can be more reliably prevented from falling within the tolerance range for voltage drops of the entire first LED array 33 or the entire second LED array 34, which are LED groups disposed between the inspection wiring line 18 and the anode end of the power supply wiring line 23b that is opposite to the inspection wiring line 18 or the cathode end of the power supply wiring line 23b that is opposite to the inspection wiring line 18. In this way, defective LEDs 22 can be more reliably detected.

$$n > Vf\text{max}/\Delta Vf \qquad \text{formula (1)}$$

$$n1 < Vf\text{max}/\Delta Vf \qquad \text{formula (2)}$$

$$n2 < Vf\text{max}/\Delta Vf \qquad \text{formula (3)}$$

Moreover, in the present embodiment, the inspection wiring line 18 is connected to the power supply wiring line 23b such that n1 and n2 are equal to each other. In such a configuration, when the LEDs 22 connected to the power supply wiring line 23b are inspected by being divided into two groups, the tolerance range for voltage drops of the first LED array 33, which is the group of LEDs 22 disposed between the inspection wiring line 18 and the anode end of the power supply wiring line 23b that is opposite to the inspection wiring line 18, is equal to the tolerance range for voltage drops of the second LED array 34, which is the group of LEDs 22 disposed between the inspection wiring line 18 and the cathode end of the power supply wiring line 23b that is opposite to the inspection wiring line 18. Thus, the two inspections can be conducted with the same amount of accuracy.

A liquid crystal display device 10 of the present embodiment has the above-mentioned configuration. The method of inspecting the LED substrate 23 included in the liquid crystal display device 10 will be explained next. During the manufacturing process of the liquid crystal display device 10, the following method can be used to inspect whether or not the mounted LEDs 22 light up correctly. This can be done after assembly of the backlight device 13 has been completed or after assembly of the liquid crystal display device 10 has been completed. In other words, the method for inspecting the LED substrate 23 includes, at a minimum: a first voltage measurement step that measures a voltage drop between the inspection terminal 21 connected to the inspection wiring line 18 and the anode-side power supply terminal 19a that is connected to the anode end of the power supply wiring line 23b that is opposite to the inspection wiring line 18; a first determination step that determines whether or not there are any defective LEDs 22 in the first LED array 33 that is formed of LEDs 22 disposed between the inspection terminal 21 and the anode-side power supply terminal 19a by comparing the voltage drop measured during the first voltage measurement step to a reference value; a second voltage measurement step that measures a voltage drop between the inspection terminal 21 connected to the inspection wiring line 18 and the cathode-side power supply terminal 19b that is connected to the cathode end of the power supply wiring line 23b that is opposite to the inspection wiring line 18; and a second determination step that determines whether or not there are any defective LEDs 22 in the second LED array 34 that is formed of LEDs 22 disposed between the inspection terminal 21 and the cathode-side power supply terminal 19b by comparing the voltage drop measured during the second voltage measurement step to a reference value. During the above-mentioned first and second voltage measurement steps, the inspection connectors 35 are respectively attached to the respective ends of the LED substrate 23 in the long side direction.

Specifically, by first conducting the first voltage measurement step, a voltage drop is obtained for the first LED array 33 that is formed of LEDs 22 disposed between the inspection terminal 21 that is connected to the inspection wiring line 18 and the anode-side power supply terminal 19a that is connected to the anode end of the power supply wiring line 23b that is opposite to the inspection wiring line 18. During the first determination step that is conducted next, the voltage drop measured during the first voltage measurement step is compared to a reference value. It is possible to use as the reference value a numerical range that represents the range from the maximum value to the minimum value of the tolerance for voltage drops of the first LED array 33 disposed between the inspection terminal 21 and the anode-side power supply terminal 19a, for example. This numerical range that will be used as the reference value is relatively small compared to a numerical range used a reference value when all of the LEDs 22 disposed between the anode-side power supply terminal 19a and the cathode-side power supply terminal 19b are inspected at the same time using the power supply wiring line 23b. Thus, it is possible to prevent voltage drops of a single LED 22 from falling within this numerical range. As a result, if there are defective LEDs 22, such as LEDs 22 that have shorted or do not open properly, in the first LED array 33, there is a high likelihood that these defective LEDs 22 will be detected.

Next, by conducting the second voltage measurement step, a voltage drop is obtained for the second LED array 34 that is formed of LEDs 22 disposed between the inspection terminal 21 connected to the inspection wiring line 18 and the cathode-side power supply terminal 19b that is connected to the cathode end of the power supply wiring line 23b that is opposite to the inspection wiring line 18. During the second determination step that is conducted next, the voltage drop measured during the second voltage measurement step is compared to a reference value. It is possible to use as the reference value a numerical range that represents the range from the maximum value to the minimum value of the tolerance for voltage drops of the second LED array 34 disposed between the inspection terminal 21 and the cathode-side power supply terminal 19b, for example. This numerical range that will be used as the reference value is relatively small compared to a numerical range used as a reference value when all of the LEDs 22 disposed between the anode-side power supply terminal 19a and the cathode-side power supply terminal 19b are inspected at the same time using the power supply wiring line 23b. Thus, it is possible to prevent voltage drops of a single LED 22 from falling within this numerical range. As a result, if there are defective LEDs 22, such as LEDs 22 that have shorted or do not open properly, in the second LED array 34, there is a high likelihood that these defective LEDs 22 will be detected.

The above-mentioned method of inspecting the LED substrate 23 will be explained again used specific numerical values. In this example, the reference value for voltage drops of a single LED 22 is 3.2V, for example, and the tolerance range for voltage drops of a single LED 22 is 2.95V to 3.45V, for example. In such a case, Vfmin, which is the minimum value for the tolerance of voltage drops of a single LED 22, is 2.95V, while Vfmax, which is the maximum value for the tolerance, is 3.45V. The difference $\Delta$Vf between the minimum value Vfmin and the maximum value Vfmax is 0.5V. Thus, the tolerance range for voltage drops of all of the LEDs 22 when all of LEDs 22, which are connected to the power supply wiring line 23b and are disposed between the anode-side power supply terminal 19a and the cathode-side power supply terminal 19b, are working properly is 23.6V to 27.6V. The difference $\Delta$Vfa between the maximum value and the minimum value is 4V. Therefore, $\Delta$Vfa, which is the difference between the maximum value and the minimum value of the tolerance range for voltage drops of all of the LEDs 22, is larger than the maximum value Vfmax for voltage drops of a single LED 22. As a result, if all of the LEDs 22 connected to the power supply wiring line 23b are inspected at the same time and there is one defective LED 22 that does not light up properly, the measured voltage drop will fall within a numerical range of 20.65V to 24.15V, which overlaps the numerical range of 23.6V to 27.6V when all of the LEDs 22 are working properly. Thus, if the measurement result falls within the range of 23.6V of 24.15V, it is both possible that all of the LEDs 22 are working properly and also possible that one of the LEDs 22 is defective. This means that there is a lower likelihood that a defective LED 22 will be detected.

Using the above-mentioned method of inspecting the LED substrate 23 as a countermeasure, when using the first voltage inspection step to measure voltage drops of the first LED array 33 that is formed of four LEDs 22 disposed between the inspection terminal 21 and the anode-side power supply terminal 19a, the measurement result will fall within a numerical range of 11.8V to 13.8V when all of the LEDs 22 forming the first LED array 33 are working properly. The difference $\Delta$Vfg between the maximum value and the minimum value will thus be 2V. Therefore, the difference $\Delta$Vfg will be lower than the maximum value Vfmax (3.45V) for a voltage drop of a single LED 22. As a result, if one of the LEDs 22 included in the first LED array 33 is defective and does not light up properly, a voltage drop obtained during the first voltage measurement step will fall within a numerical range of 8.85V to 10.35V. This numerical range will not overlap 11.8V to 13.8V, which is the numerical range for the entire first LED array 33 when all of the LEDs 22 are working properly. Therefore, if the measurement result falls within the numerical range of 8.85V to 10.35V, it can be determined with near certainty during the first determination step that one of the LEDs 22 is defective. This means that defective LEDs 22 can be detected with a high degree of reliability. Since the second LED array 34 is formed of the same number of LEDs 22 as the first LED array 33, defective LEDs 22 in the second LED array 34 can be detected with a high degree of reliability by using the second voltage measurement step and the second determination step to inspect the second LED array 34 in a manner similar to the manner in which the first voltage measurement step and the first determination step were used to inspect the first LED array 33.

As described above, the LED substrate (light source substrate) 23 of the present embodiment includes: a substrate section 23a; a plurality of LEDs (light sources) 22 mounted on the substrate section 23a; a power supply wiring line 23b that is disposed on the substrate section 23a and can provide power to the plurality of LEDs 22 by connecting the plurality of LEDs 22 in series; and an inspection wiring line 18 that is disposed on the substrate section 23a and that is connected to a portion of the power supply wiring line 23b that connects two adjacent LEDs 22 that are included among the plurality of LEDs 22.

In such a configuration, the plurality of LEDs 22 mounted on the substrate section 23a are lit by receiving power from the power supply wiring line 23b that is disposed on the substrate section 23a and that connects the plurality of LEDs 22 in series. When the plurality of LEDs 22 are inspected for problems, the inspection is carried out using the power supply wiring line 23b and the inspection wiring line 18. If all of the LEDs 22 are inspected at the same time using the power supply wiring line 23b, there is the possibility that a voltage drop of a single LED 22 may fall within the tolerance range (the range between the maximum value and the minimum value) for voltage drops for all of the LEDs 22 as a whole. This may lead to defective LEDs 22 not being detected. As a countermeasure, the inspection wiring line 18 is connected to a portion of the power supply wiring line 23b that connects a pair of adjacent LEDs 22 that are included among the plurality of LEDs 22. Thus, the inspection wiring line 18 measures a voltage drop between the inspection wiring line 18 and one end of the power supply wiring line 23b that is opposite to the inspection wiring line 18 and measures a voltage drop between the inspection wiring line 18 and another end of the power supply wiring line 23b that is opposite to the inspection wiring line 18, for example. Thus, the plurality of LEDs 22 mounted on the substrate section 23a can be divided into at least two groups and then inspected. Therefore, if the location where the inspection wiring line 18 connects to the power supply wiring line 23b is appropriately set, the voltage drop of a single LED 22 can prevented from falling within the tolerance range for voltage drops of a whole group of LEDs 22 disposed between the inspection wiring line 18 and one end or another end of the power supply wiring line 23b that is opposite to the inspection wiring line 18. As a result, it is possible to more reliably detect defective LEDs 22.

In addition, the inspection wiring line 18 is connected to the power supply wiring line 23b such that $\Delta$Vfg is smaller than Vfmax, where $\Delta$Vfg is the difference between the maximum value and the minimum value of the tolerance for voltage drops measured between the inspection wiring line 18 and one end or another end of the power supply wiring line 23b that is opposite to the inspection wiring line 18, and Vfmax is the maximum value of the tolerance for the voltage drop of a single LED 22 included in the plurality of LEDs 22. In such a configuration, the voltage drop of a single LED 22 can be more reliably prevented from falling within the tolerance range for voltage drops of an entire group of LEDs 22 disposed between the inspection wiring line 18 and one end or another end of the power supply wiring line 23b that is opposite to the inspection wiring line 18. Thus, it is possible to increase the reliability in detecting defective LEDs 22.

In addition, the inspection wiring line 18 is connected to the power supply wiring line 23b such that n1 and n2 are respectively less than the value of Vfmax/ΔVf when "n" is greater than Vfmax/ΔVf, where ΔVf is the difference between the maximum value and minimum value of a voltage drop of a single LED 22 included in the plurality of LEDs 22, Vfmax is the maximum value of the tolerance for a voltage drop of a single LED 22, "n" is the total number of LEDs 22 included in the plurality of LEDs 22, n1 is the number of LEDs 22 disposed between the inspection wiring line 18 and the one end of the power supply wiring line 23b that is opposite to the inspection wiring line 18, and n2 is the number of LEDs 22 disposed between the inspection wiring line 18 and the other end of the power supply wiring line 23b that is opposite the inspection wiring line 18. In such a configuration, if "n," which is total number of LEDs 22 included in the plurality of LEDs 22, is greater than Vfmax/ΔVf, the voltage drop of a single LED 22 will fall within the tolerance range for voltage drops for all of the LEDs 22 as a whole when all of the LEDs 22 are inspected at the same time using the power supply wiring line 23b. Thus, it is possible that defective LEDs 22 will not be detected. As a countermeasure, the inspection wiring line 18 is connected to the power supply wiring line 23b such that n1, which is the total number of LEDs 22 disposed between the inspection wiring line 18 and the one end of the power supply wiring line 23b that is opposite to the inspection wiring line 18, and n2, which is the total number of LEDs 22 disposed between the inspection wiring line 18 and the other end of the power supply wiring line 23b that is opposite to the inspection wiring line 18, are respectively greater than Vfmax/ΔVf. Thus, the voltage drop of a single LED 22 can be more reliably prevented from falling within the tolerance range for voltage drops of a group of LEDs 22 disposed between the inspection wiring line 18 and the one end or the other end of the power supply wiring line 23b that is opposite to the inspection wiring line 18. In this way, defective LEDs 22 can be more reliably detected.

In addition, the inspection wiring line 18 is connected to the power supply wiring line 23b such that n1 and n2 are equal to each other. In such a configuration, when the plurality of LEDs 22 mounted on the substrate section 23a are divided into at least two groups and inspected, the tolerance range for voltage drops of the entire group of LEDs 22 disposed between the inspection wiring line 18 and the one end of the power supply wiring line 23b that is opposite to the inspection wiring line 18 is the same as the tolerance range for voltage drops of the entire group of LEDs 22 disposed between the inspection wiring line 18 and the other end of the power supply wiring line 23b that is opposite to the inspection wiring line 18. Thus, two or more inspections can be conducted with the same amount of accuracy.

In addition, the light source substrate 23 is further provided with the following: power supply terminals 19 that are respectively disposed on an end of the substrate section 23a and respectively connected to an end of the power supply wiring line 23b; and inspection terminals 21 that are respectively disposed adjacent to the power supply terminals 19 on the ends of the substrate section 23a and respectively connected to an end of the inspection wiring line 18. In such a configuration, the power supply terminals 19 and the inspection terminals 21 are disposed on the ends of the substrate section 23a so as to be mutually adjacent. Thus, it is easier to connect an inspection device to the power supply terminals 19 and the inspection terminals 21 when the device is being inspected. Specifically, if an inspection connector, which includes terminal clamps that respectively contact the power supply terminals 19 and the inspection terminals 21, is provided in the inspection device, for example, it becomes easier to connect to the terminals, which leads to an increase in work efficiency.

The liquid crystal display device (display device) 10 of the present embodiment includes: a backlight device (illumination device) 13 that has, at a minimum, the above-mentioned LED substrate 23; and a liquid crystal panel (display panel) 11 that displays images by utilizing light from the backlight device 13. In such a liquid crystal display device 10, there is a high likelihood of being able to detect defective LEDs 22 on the LED substrate 23 included in the backlight device 13. Thus, it is less likely that uneven brightness will occur in light provided to the liquid crystal panel 11, which means that there will be an improvement in display quality of images displayed on the liquid crystal panel 11. Moreover, LEDs 22 disposed in a plurality on LED substrates 23 used in backlight devices 13 included in such liquid crystal display devices 10 tend to be brighter than LEDs 22 used in photograph processing devices and the like, for example. Thus, the tolerance of voltage drops for a single LED 22 tends to be higher, which leads to concerns that defective LEDs 22 will not be detected during inspection. As a countermeasure, the plurality of LEDs 22 mounted on the above-described substrate section 23a are divided into at least two groups and then inspected, which increases reliability in detecting defective LEDs 22.

The method of inspecting the LED substrate 23 of the present embodiment includes, at a minimum: a first voltage measurement step that measures a voltage drop between one end of the power supply wiring line 23b that is opposite to the inspection wiring line 18 and the inspection wiring line 18 that is connected to a portion of the power supply wiring line 23b, which is able to provide power to the plurality of LEDs 22 mounted on the substrate section 23a by connecting the plurality of LEDs 22 in series, the portion connecting a pair of adjacent LEDs 22 that are included in the plurality of LEDs 22; a first determination step that determines whether or not there are any defective LEDs 22 among the LEDs 22 disposed between the inspection wiring line 18 and the one end of the power supply wiring line 23b that is opposite to the inspection wiring line 18 by comparing the voltage drop measured during the first voltage measurement step to a reference value; a second voltage measurement step that measures a voltage drop between the inspection wiring line 18 and the other end of the power supply wiring line 23b that is opposite to the inspection wiring line 18; and a second determination step that determines whether or not there are any defective LEDs 22 among the LEDs 22 disposed between the inspection wiring line 18 and the other end of the power supply wiring line 23b that is opposite to the inspection wiring line 18 by comparing the voltage drop measured during the second voltage measurement step to a reference value.

In such a configuration, by carrying out the first voltage measurement step and the second voltage measurement step, it is possible to respectively obtain a voltage drop of the LEDs 22 disposed between the inspection wiring line 18 and the one end of the power supply wiring line 23b that is opposite to the inspection wiring line 18 and a voltage drop of the LEDs 22 disposed between the inspection wiring line 18 and the other end of the power supply wiring line 23b that is opposite to the inspection wiring line 18. Next, in the first determination step and the second determination step, the voltage drops obtained in the first voltage measurement step and the second voltage measurement step are respectively compared to reference values. It is possible to use as the reference value a numerical range that represents a range from the maximum value to the minimum value of the tolerance for voltage drops of LEDs 22 disposed between the inspection wiring line 18 and the one end of the power supply wiring line 23b that is opposite to the inspection wiring line 18, or a numerical range that represents the range from the maximum value to the minimum value of the tolerance for voltage drops of LEDs 22 disposed between the inspection wiring line 18 and the other end of the power supply wiring line 23b that is opposite to the inspection wiring line 18, for example. This numerical range that will be used as the reference value is relatively small compared to a numerical range used a reference value when all of the LEDs 22 are inspected at the same time using the power supply wiring line 23b. Thus, it is possible to prevent voltage drops of a single LED 22 from falling within this numerical range, and as a result, it is possible to increase reliability in detecting defective LEDs 22.

Embodiment 2

Embodiment 2 of the present invention will be described with reference to FIG. 6. In Embodiment 2, an example will be explained which includes protection diodes 36 that are used to protect LEDs 122. Descriptions of structures, operations, and effects similar to those of Embodiment 1 will be omitted.

Figure 6:
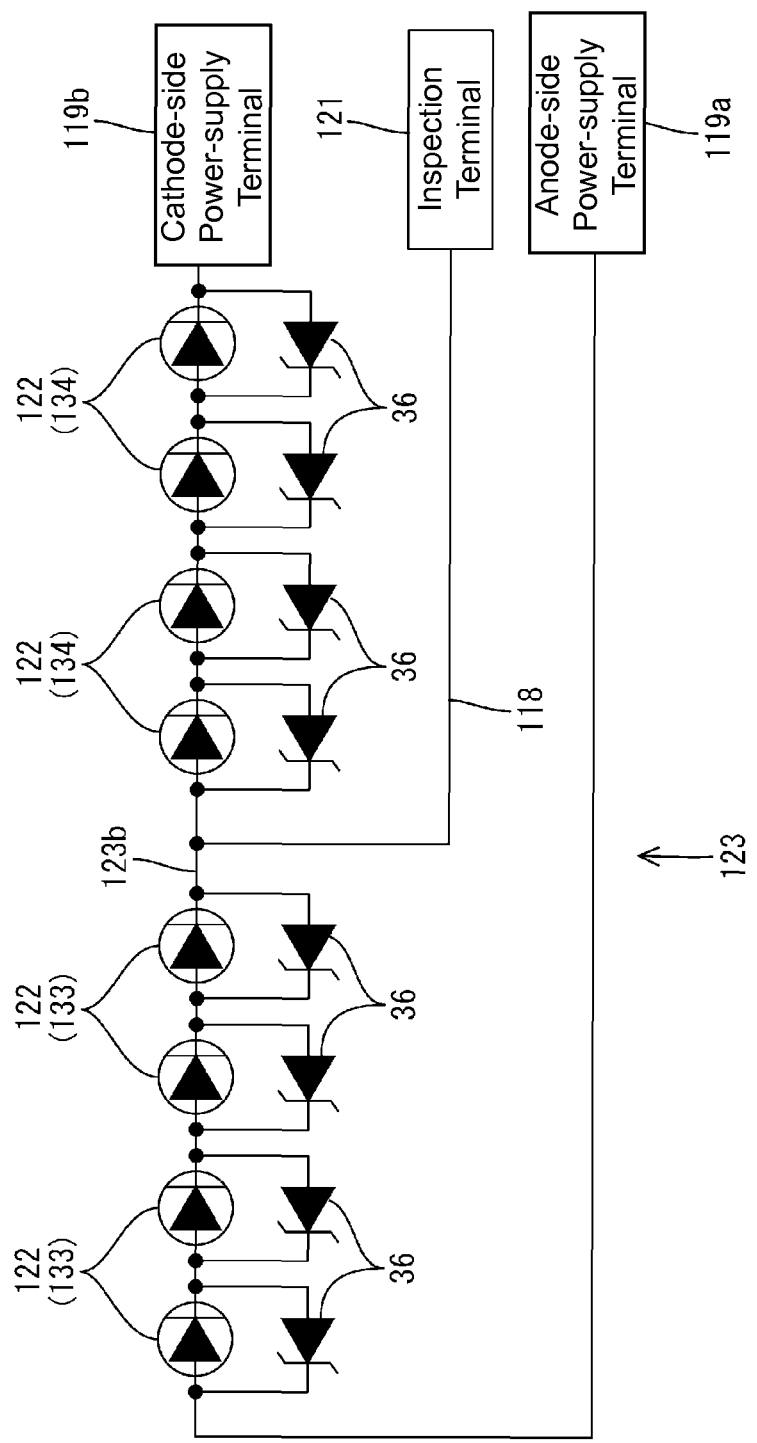
FIG. 6 is a circuit diagram that illustrates an electrical connection configuration of LEDs in an LED substrate according to Embodiment 2 of the present invention.

As shown in FIG. 6, protection diodes 36, which are individually connected to the respective LEDs 122 in parallel and which have a polarity opposite to that of the respective LEDs 122, are provided on an LED substrate 123 of the present embodiment. The number of protection diodes 36 is equal to the number of LEDs 122. The protection diodes 36 are so-called Zener diodes, and the Zener voltage of the Zener diodes is larger than the voltage drop of a single LED 122. The protection diodes 36 may be embedded within the LEDs 122 or may be formed on a substrate section of the LED substrate 123 so as to be externally-attached to the LEDs 122. If a protection diode 36 is embedded within an LED 122, the anode terminal of the protection diode 36 is connected to the cathode terminal of the LED 122, and the cathode terminal of the protection diode 36 is connected to the anode terminal of the LED 122. Meanwhile, if a protection diode 36 is formed on the substrate section of the LED substrate 123 so as to be externally attached to the LED 122, the anode terminal of the protection diode 36 is connected to a portion of a power supply wiring line 123b to which the cathode terminal of the LED 122 is connected, and the cathode terminal of the protection diode 36 is connected to a portion of the power supply wiring line 123b that is connected to the anode terminal of the LED 122. In such a configuration, when current passes through all of the LEDs 122 connected via the power supply wiring line 123b in a normal manner, a forward bias voltage is applied to the respective LEDs 122 and respective LED chips emit light. Meanwhile, when a relatively high reverse bias voltage is applied to the LEDs 122 via static electricity or the like, for example, current selectively flows to the protection diodes 36, which are individually connected in parallel to the respective LEDs 122 and have a polarity opposite of the respective LEDs 122. In this way, the protection diodes 36 protect the respective LEDs 122. Moreover, the protection diodes 36 are Zener diodes in which the Zener voltage is larger than the voltage drop of a single LED 122. Thus, when a forward bias voltage is applied to the respective LEDs 122 via the power supply wiring line 123b, current can prevented from flowing to the protection diodes 36, which are Zener diodes. Meanwhile, if forward bias static electricity is applied to the power supply wiring line 123b, the protection diodes 36 can protect the respective LEDs 122 as a result of current selectively flowing to the protection diodes 36, which are Zener diodes. Furthermore, even if one of the LEDs 122 does not open properly, it is possible for current to be supplied to the LEDs 122 other than the improperly-opened LED 122 and for the LEDs 122 to be lit since the protection diodes 36, which are Zener diodes, function as a bypass.

Next, the effect of the protection diodes 36 during the inspection of the LED substrate 123 will be explained next. If the LEDs 122 connected in parallel are functioning normally, a voltage drop of the protection diodes 36 will not be measured during inspection. However, if the one of the LEDs 122 included in an LED 122 array has not opened properly, a voltage drop of the protection diodes 36, or in other words, a Zener voltage, will be measured since the protection diode 36 that is connected in parallel to the improperly-opened LED 122 will function as a bypass.

An example will be given here using specific numerical values. The Zener voltage of the protection diodes 36 is 6.3V, for example, and the tolerance range thereof is 6.1V to 6.5V. Therefore, Vzmin, which is the minimum value of the tolerance for the Zener voltage of the protection diodes 36, is 6.1V. The reference value for the voltage drop of a single LED 122 and the tolerance range thereof are the same as in Embodiment 1. If there is an improperly opened LED 122 among the LEDs 122 connected to the power supply wiring line 123b and all of the LEDs 122 connected to the power supply wiring line 123b are inspected at the same time, the tolerance range of the voltage drop measured during the inspection will be 26.75V to 30.65V, with the difference $\Delta Vfa$ between the maximum value and minimum value being 3.9V. In other words, since the difference $\Delta Vfa$ is larger than the maximum value Vfmax (3.45V) for the voltage drop of a single LED 122, it is possible that a shorted LED 122 will not be detected even if such an LED 122 exists.

As a countermeasure, in the present embodiment, an inspection wiring line 118 is connected to the power supply wiring line 123b such that $\Delta Vfg$ is less than Vfmax and Vzmin, where $\Delta Vfg$ is the difference between the maximum value and minimum value for the tolerance of voltage drops for a first LED array 133 formed of four LEDs 122 disposed between the inspection terminal 121 connected to the inspection wiring line 118 and the anode-side power supply terminal 119a and voltage drops for a second LED array 134 formed of four LEDs 122 disposed between the inspection terminal 121 connected to the inspection wiring line 118 and the cathode-side power supply terminal 119b, Vfmax is the maximum value of the tolerance for a voltage drop of a single LED 122, and Vzmin is the minimum value of the tolerance for a voltage drop of the protection diodes 36. In such a configuration, it is less likely that the voltage drop of a single LED 122 and the Zener voltage of a single protection diode 36, which is a Zener diode, will fall within the tolerance range for the entire first LED array 133 or the entire second LED array 134, which are groups of LEDs 122 disposed between the inspection wiring line 118 and the anode-side end or the cathode-side end of the power supply wiring line 123b that is opposite to the inspection wiring line 118. Specifically, when the voltage drop of the first LED array 133, which consists of four LEDs 122 disposed between the inspection terminal 121 and the anode-side power supply terminal 119a is measured, if one of the LEDs 122 included in the first LED array 133 has not properly opened (and the other three LEDs 122 are working properly), the numerical range of the measurement result will be 14.95 to 16.85V, for example. Thus, this value will not overlap the numerical range (11.8V to 13.8V) for when all of the LEDs 122 that form the first LED array 133 are working properly. Therefore, if the measurement result falls within the numerical range of 14.95V to 16.85V, it can be determined with near certainty that one of the LEDs 122 has not opened properly. This means that improperly-opened LEDs 122 can be detected with a high degree of reliability. The second LED array 134 has the same number of LEDs 122 as the first LED array 133. Thus, in a manner similar to that for the first LED array 133, improperly-opened LEDs 122 in the second LED array 134 can be detected during inspection with a high degree of reliability.

According to the description of the present embodiment given above, the plurality of LEDs 122 respectively have a semiconductor light-emitting element, and protection diodes 36, which are individually connected in parallel to the LEDs 122 included in the plurality of LEDs 122 and have a polarity opposite of the LEDs 122, are provided. In such a configuration, when a forward bias voltage is applied to the plurality of LEDs 122 via the power supply wiring line 123b, the respective semiconductor light-emitting elements included in the plurality of LEDs 122 emit light. Meanwhile, if a reverse bias voltage is applied to the plurality of LEDs 122 via static electricity or the like, for example, the protection diodes 36 can protect the LEDs 122 as a result of current selectively flowing to the protection diodes 36, which are individually connected in parallel to the LEDs 122 contained in the plurality of LEDs 122 and which have a polarity opposite of the LEDs 122.

Furthermore, the protection diodes 36 are Zener diodes in which the Zener voltage is higher than the voltage drop of a single LED 122. In such a configuration, by using Zener diodes, which have a Zener voltage higher than the voltage drop of a single LED 122, as protection diodes 36, current can be prevented from flowing to the Zener diodes when a forward bias voltage is applied to the plurality of LEDs 122 via the power supply wiring line 123b. Meanwhile, when forward bias static electricity is applied to the plurality of LEDs 122, the LEDs 122 can be protected since current will selectively flow to the Zener diodes. In addition, even if one of the LEDs 122 included in the plurality of LEDs 122 is improperly opened, it is possible to provide current to the other LEDs 122 since the Zener diode functions as a bypass.

In addition, the inspection wiring line 118 is connected to the power supply wiring line 123b such that $\Delta Vfg$ is smaller than both Vfmax and Vzmin, where $\Delta Vfg$ is the difference between the maximum value and the minimum value of the tolerance for voltage drops measured between the inspection wiring line 118 and the one end or the other end of the power supply wiring line 123b opposite to the inspection wiring line 118, Vfmax is the maximum value of the tolerance for voltage drops for a single LED 122 included in the plurality of LEDs 122, and Vzmin is the minimum value for the tolerance of the Zener voltage for a single Zener diode. In such a configuration, it is possible to reliably prevent voltage drops of a single LED 122 and the Zener voltage of a single Zener diode from falling within the tolerance range for voltage drops of a group of LEDs 122 disposed between the inspection wiring line 118 and one end or another end of the power supply wiring line 123b opposite to the inspection wiring line 118. In this way, it is possible to more reliably detect LEDs 122 that are not working properly.

Embodiment 3

Embodiment 3 of the present invention will be described with reference to FIG. 7. In Embodiment 3, an example will be used in which the number of LEDs 222 connected by the power supply wiring line 223b is different than in Embodiment 1, and in which the number of inspection wiring lines 218 and inspection terminals 221 is different than in Embodiment 1. Descriptions of structures, operations, and effects similar to those of Embodiment 1 will be omitted.

Figure 7:
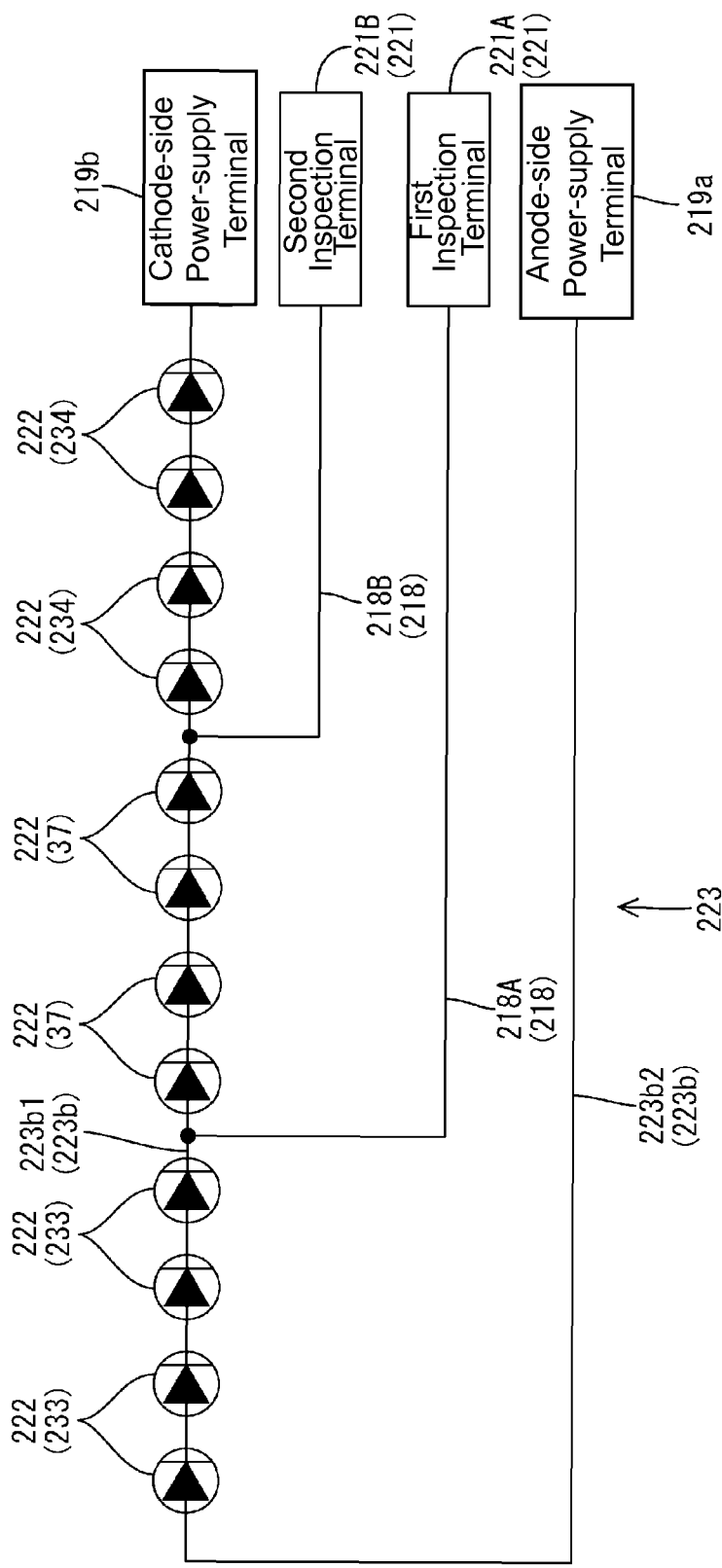
FIG. 7 is a circuit diagram that illustrates an electrical connection configuration of LEDs in an LED substrate according to Embodiment 3 of the present invention.

As shown in FIG. 7, a total of twelve LEDs 222 are connected in series by one power supply wiring line 223b on an LED substrate 223 according to the present embodiment. As a result, two inspection wiring lines 218 and two inspection terminals 221 are provided for each power supply wiring line 223b system, or in other words, there are twice as many inspection wiring line 218 systems and twice as many inspection terminals 221 as power supply wiring line 223b systems. Thus, it is possible to divide the twelve LEDs 222 connected to one power supply wiring line 223b into three groups and then inspect the LEDs 222.

Specifically, two inspection wiring lines 218 are disposed so as to be sandwiched between a first extension section 223b1 and second extension section 223b2 that form the power supply wiring line 223b. The inspection wiring lines 218 respectively contain a first inspection wiring line 218A that is disposed relatively close to the second extension section 223b2, and a second inspection wiring line 218B that is disposed relatively close to the first extension section 223b1. The first inspection wiring line 218A is connected to the first extension section 223b1 such that four LEDs 222 (hereafter referred to as a first LED array 233) are interposed between the anode-side power supply terminal 219a and the location where the first inspection wiring line 218A is connected to the first extension section 223b1. The second inspection wiring line 218B is connected to the first extension section 223b1 such that four LEDs 222 (hereafter referred to as a second LED array 234) are interposed between the cathode-side power supply terminal 219b and the location where the second inspection wiring line 218B is connected to the first extension section 223b1. Therefore, four LEDs 222 (hereafter referred to as a third LED array (third light source array) 37) are interposed between the location where the first inspection wiring line 218A connects to the first extension section 223b1 and the location where the second inspection wiring line 218B connects to the first extension section 223b1. In this way, the two inspection wiring lines 218 are connected to the power supply wiring line 223b such that n1, n2, and n3 are equal to each other, where n1 is the number of LEDs 222 interposed between the first inspection wiring line 218A and the anode-side power supply terminal 219a, n2 is the number of LEDs 222 interposed between the second inspection wiring line 218B and the cathode-side power supply terminal 219b, and n3 is the number of LEDs 222 interposed between the first inspection wiring line 218A and the second inspection wiring line 218B. The device is configured such that n3, which is the number of LEDs 222 interposed between the first inspection wiring line 218A and the second inspection wiring line 218B, satisfies formula (4) shown below. As a result, the voltage drop of a single LED 222 can be more reliably prevented from falling within the tolerance range for voltage drops of the entire third LED array 37, which is a group of LEDs 222 disposed between the first inspection wiring line 218A and the second inspection wiring line 218B. As a result, it is possible to increase reliability in detecting defective LEDs 222. The device is configured such that n1, and n2, which respectively represent a number of LEDs 222, satisfy formulas (2) and (3) of Embodiment 1, and is further configured such that "n," which is the total number of LEDs 222 connected to the power supply wiring line 223b, satisfies formula (1) of Embodiment 1. In contrast, two inspection terminals 221 are disposed so as to be sandwiched in the Y-axis direction between the anode-side power supply terminal 219a and the cathode-side power supply terminal 219b that make up the power supply terminals 219 on one end of the substrate section of the LED substrate 223. The inspection terminals 221 include a first inspection terminal 221A that is disposed relatively close to the anode-side power supply terminal 219a, and a second inspection terminal 221B.

$$n3 < Vfmax/\Delta Vf \quad \text{formula (4)}$$

The method for inspecting the LED substrate 223 that has the above-mentioned configuration includes, at a minimum: a first voltage measurement step that measures a voltage drop between the first inspection terminal 221A connected to the first inspection wiring line 218A and the anode-side power supply terminal 219a that is connected to the anode end of the power supply wiring line 223b that is opposite to the first inspection wiring line 218A; a first determination step that determines whether or not there are any defective LEDs 222 in the first LED array 233 disposed between the inspection terminal 221A and the anode-side power supply terminal 219a by comparing the voltage drop measured during the first voltage measurement step to a reference value; a second voltage measurement step that measures a voltage drop between the second inspection terminal 221B that is connected to the second inspection wiring line 218B and the cathode-side power supply terminal 219b that is connected to the cathode end of the power supply wiring line 223b that is opposite to the second inspection wiring line 218B; a second determination step that determines whether or not there are any defective LEDs 222 in the second LED array 234 disposed between the second inspection terminal 221B and the cathode-side power supply terminal 219b by comparing the voltage drop measured during the second voltage measurement step to a reference value; a third voltage measurement step that measures a voltage drop between the first inspection terminal 221A connected to the first inspection wiring line 218A and the second inspection terminal 221B connected to the second inspection wiring line 218B; and a third determination step that determines whether or not there are any defective LEDs 222 in the third LED array 37 disposed between the first inspection terminal 221A and the second inspection terminal 221B by comparing the voltage drop measured during the third voltage measurement step to a reference value. The first voltage measurement step, the first determination step, the second voltage measurement step, and the second determination step are nearly identical to the corresponding steps in Embodiment 1. Therefore, overlapping explanations will be omitted below and the third voltage measurement step and the third determination step will be explained hereafter.

By carrying out the third voltage measurement step, it is possible to obtain a voltage drop of the third LED array 37, which is made up of LEDs 222 disposed between first inspection terminal 221A connected to the first inspection wiring line 218A and the second inspection terminal 221B connected to the second inspection wiring line 218B. During the subsequently carried out third determination step, the voltage drop measured during the third voltage measurement step is compared to a reference value. It is possible to use, as the reference value, a numerical range from the minimum value to the maximum value of the tolerance for voltage drops of the third LED array 37 disposed between the first inspection terminal 221A and the second inspection terminal 221B, for example. This numerical range used as the reference value is relatively small compared to a numerical range used as the reference value when all of the LEDs 222 disposed between the anode-side power supply terminal 219a and the cathode-side power supply terminal 219b are inspected at the same time using the power supply wiring line 223b. Thus, the voltage drop of a single LED 222 can be prevented from falling within the numerical range. As a result, defective LEDs 222 can be more reliably detected when there are defective LEDs 222, such as LEDs 222 that are shorted or improperly opened, in the third LED array 37.

According to the present embodiment described above, a plurality of inspection wiring lines 218 are disposed on the substrate section 223a such that the plurality of inspection wiring lines 218 are connected to different portions of the power supply wiring line 223b such that LEDs 222 included in the plurality of LEDs 222 are interposed therebetween. In such a configuration, the LEDs 222 interposed between the plurality of inspection wiring lines 218 can be inspected by measuring a voltage drop between the plurality of inspection wiring lines 218. Therefore, since it is possible to divide the plurality of LEDs 222 mounted on the substrate section 223a into three or more groups and then inspect the LEDs 222, such a method is particularly useful when a large number of LEDs 222 are disposed on the substrate section 223a.

In addition, the plurality of inspection wiring lines 218 are connected to the power supply wiring line 223b such that n3 is less than Vfmax/$\Delta$Vf when "n" is greater than Vfmax/$\Delta$Vf, where $\Delta$Vf is the difference between the maximum value and the minimum value for voltage drops of a single LED 222 included in the plurality of LEDs 222, Vfmax is the maximum value of the tolerance for a voltage drop of a single LED 222, and n3 is the number of LEDs 222 disposed between the plurality of inspection wiring lines 218. In such a configuration, when "n," which is the total number of LEDs 222 included in the plurality of LEDs 222, is greater than Vfmax/$\Delta$Vf and all of the LEDs 222 are inspected at the same time using the power supply wiring line 223b, the voltage drop of a single LED 222 will fall within the tolerance range for voltage drops of all of the LEDs 222 as a whole. Thus, it is possible that defective LEDs 222 will not be detected. As a countermeasure, the plurality of inspection wiring lines 218 are connected to the power supply wiring line 223b such that n3, which is the number of LEDs 222 disposed between the plurality of inspection wiring lines 218, is lower than the value of Vfmax/$\Delta$Vf; thus, the voltage drop of a single LED 222 can be prevented from falling within the tolerance range for voltage drops of an entire group of LEDs 222 disposed between the plurality of inspection wiring lines 218. As a result, it is possible to more reliably detect defective LEDs 222.

Embodiment 4

Embodiment 4 of the present invention will be described with reference to FIG. 8. In Embodiment 4, an example is used in which the arrangement of inspection terminals 321 and the wiring route of the inspection wiring line 318 have been modified. Descriptions of structures, operations, and effects similar to those of Embodiment 1 will be omitted.

Figure 8:
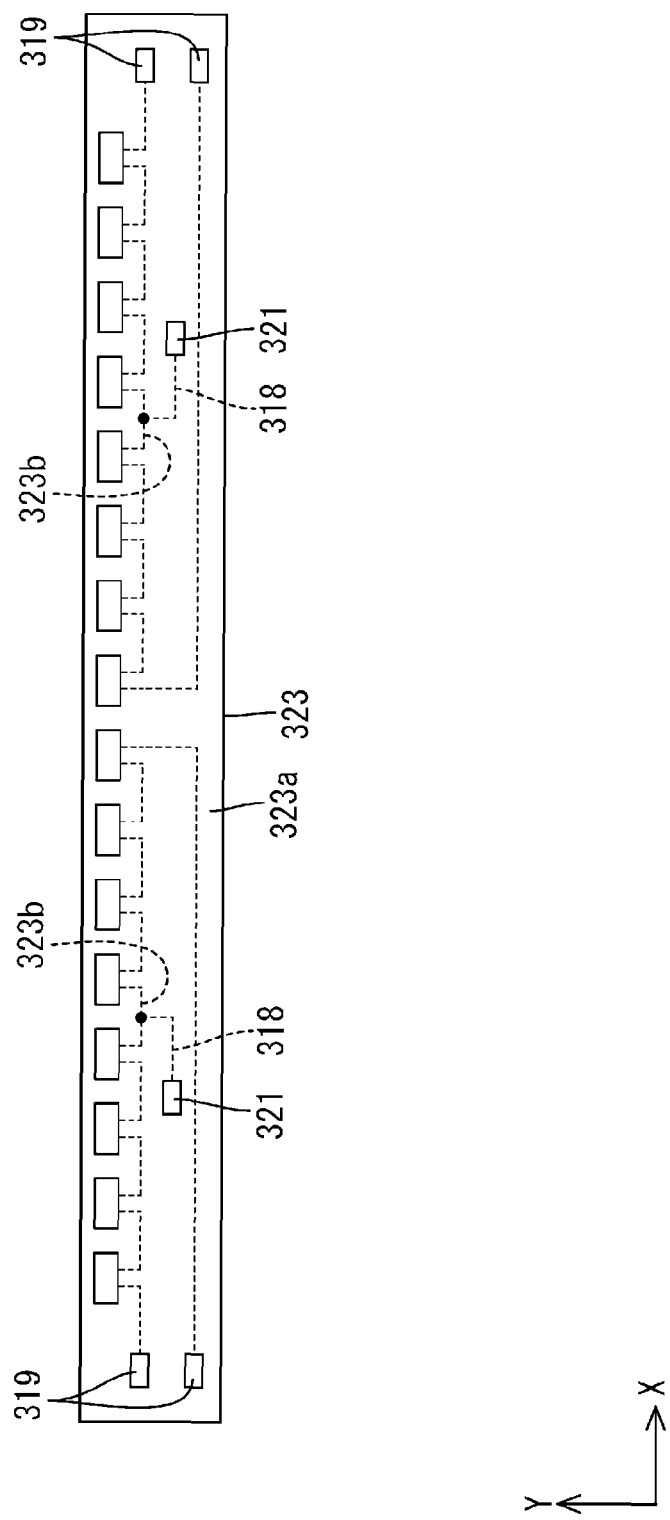
FIG. 8 is a bottom view of an LED substrate according to Embodiment 4 of the present invention.

As shown in FIG. 8, the inspection terminals 321 are formed on a substrate section 323a of an LED substrate 323 of the present embodiment so as to be located closer to the center than the ends in the length direction on which power supply terminals 319 are formed. As a result, the length of the inspection wiring line 318, which extends from the location where the inspection wiring line 318 connects to the power supply wiring line 323b to the inspection terminal 321, is shorter than the inspection wiring line described in Embodiment 1. In such a configuration, it is possible to cause the lead of an inspection device or the like to directly contact the inspection terminal 321 when inspecting the LED substrate 323.

Embodiment 5

Embodiment 5 of the present invention will be described with reference to FIGS. 9 to 12. In Embodiment 5, the backlight device 413 has been changed to a direct-lit backlight device. Descriptions of structures, operations, and effects similar to those of Embodiment 1 will be omitted.

Figure 9:
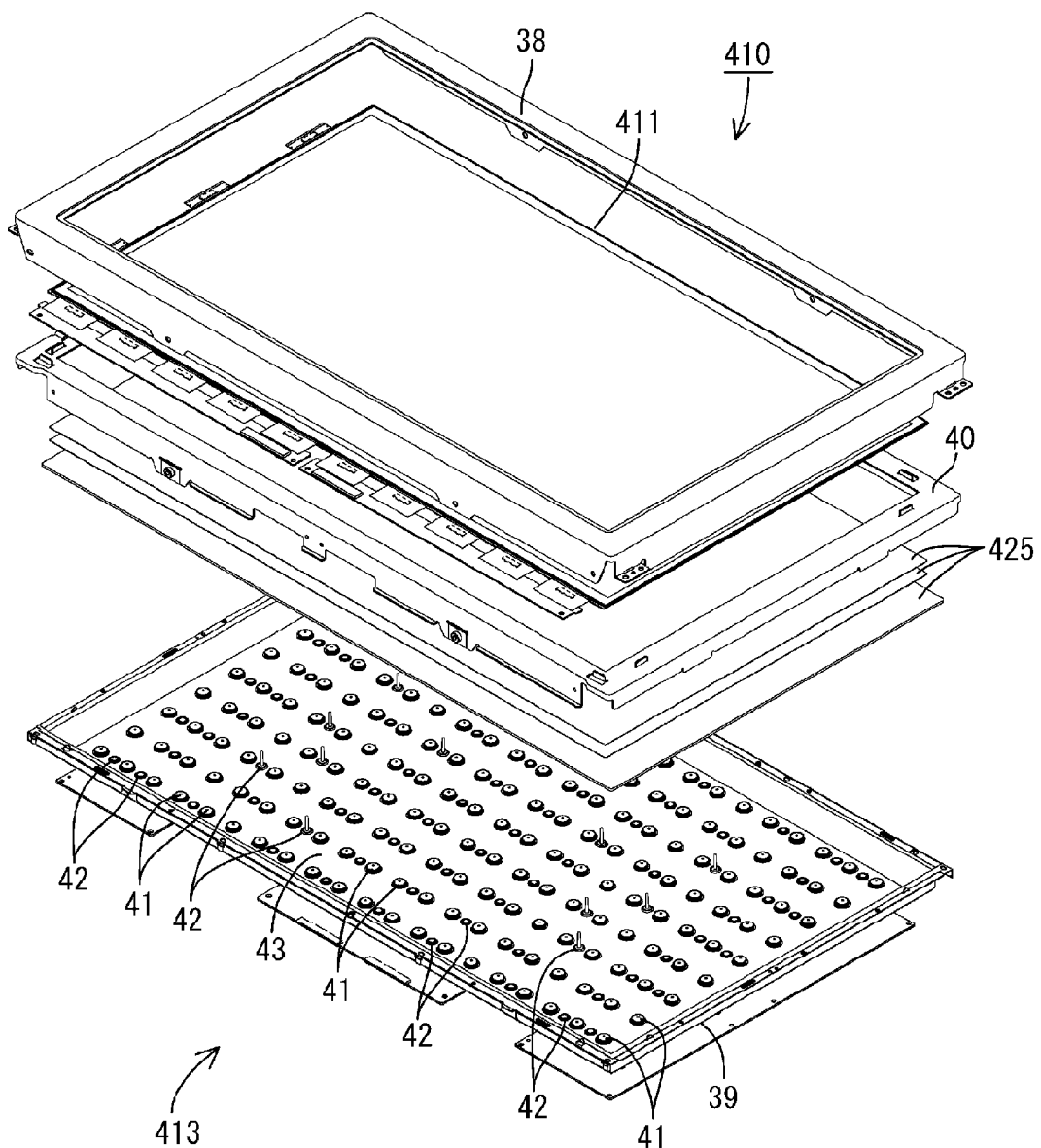
FIG. 9 is an exploded perspective that shows a schematic configuration of a liquid crystal display device according to Embodiment 5 of the present invention.
Figure 9:
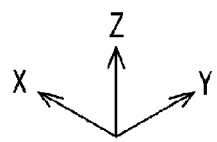

As shown in FIG. 9, a liquid crystal display device 410 according to the present embodiment has a configuration in which a liquid crystal panel 411 and the direct-lit backlight device 413 are integrally formed via a bezel 38 or the like. The configuration of the liquid crystal panel 411 is similar to that of Embodiment 1, and overlapping explanations are therefore omitted. The configuration of the direct-lit backlight device 413 will be described below.

Figure 10:
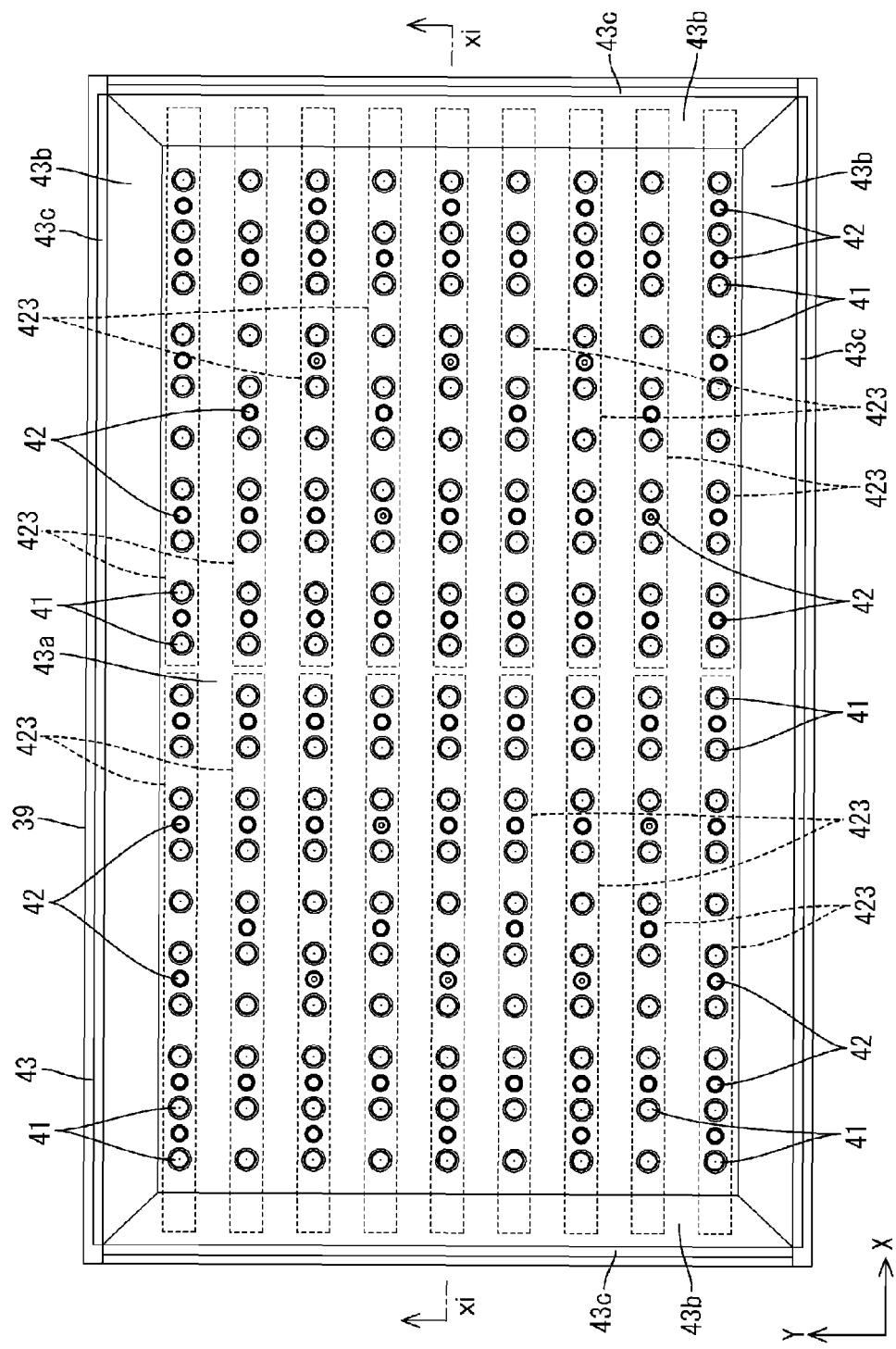
FIG. 10 is a plan view that shows the arrangement of the various components of a backlight device included in a liquid crystal display device.
Figure 11:
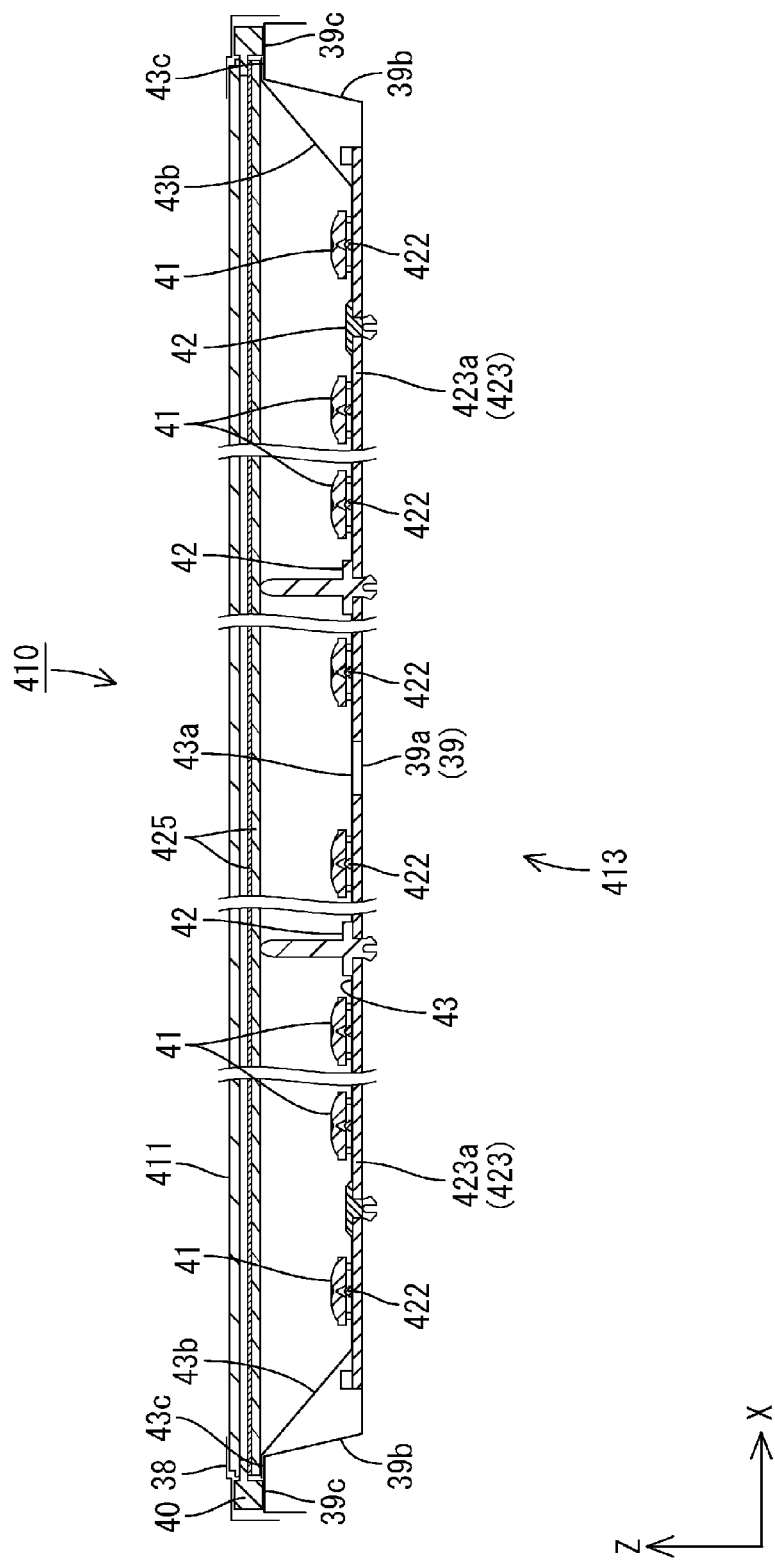
FIG. 11 is a cross-sectional view of FIG. 10 along the line xi-xi.

As shown in FIGS. 9 to 11, the backlight device 413 includes: a chassis 39 that is substantially box-shaped and that opens on the light-exiting side (the liquid crystal panel 411 side); optical sheets 425 disposed so as to cover the opening in the chassis 39; and a frame 40 that is disposed along the outer edges of the chassis 39 and which holds the outer edges of the optical sheets 425 by sandwiching the optical sheets 425 between the frame 40 and the chassis 39. In addition, the following are provided within the chassis 39: LEDs 422 that are disposed in a location directly below the optical sheets 425 (and the liquid crystal panel 411) so as to face the optical sheets 425; an LED substrate 423 on which the LEDs 422 are mounted; diffusion lenses 41 that are attached to locations of the LED substrate 423 that correspond to the LEDs 422; and a substrate holding member 42 that holds the LED substrate 423 such that the LED substrate 423 is attached to the chassis 39. Also, a reflective sheet 43 that reflects light inside the chassis 39 towards the optical sheets 425 is provided within the chassis 39. Because the backlight device 413 of the present embodiment is a direct-lit backlight device, the backlight device 413 does not include a light guide plate 24, which was used in the edge-lit backlight device 13 of Embodiment 1. Next, the various components of the backlight device 413 will be described in detail.

The chassis 39 is made of metal, and, as shown in FIGS. 10 and 11, is formed of: a bottom plate 39a that has a rectangular shape similar to the liquid crystal panel 411; side plates 39b that respectively protrude from the outer edges of the respective sides of the bottom plate 39a toward the front (light-exiting side); and supporting plates 39c that extend beyond the protruding edges of the respective side plates 39b. As a whole, the chassis has a shallow substantially box-like shape with an opening that faces toward the front. The long side direction of the chassis 39 corresponds to the X axis direction, and the short side direction thereof corresponds to the Y axis direction. The frame 40 and the optical members 425, which will be described below, can be placed, from the front side, on the respective supporting plates 39c of the chassis 39. The frame 40 is screwed onto the respective supporting plates 39c. The bottom plate 39a of the chassis 39 has attaching holes for respectively attaching the substrate holding members 42.

Figure 12:
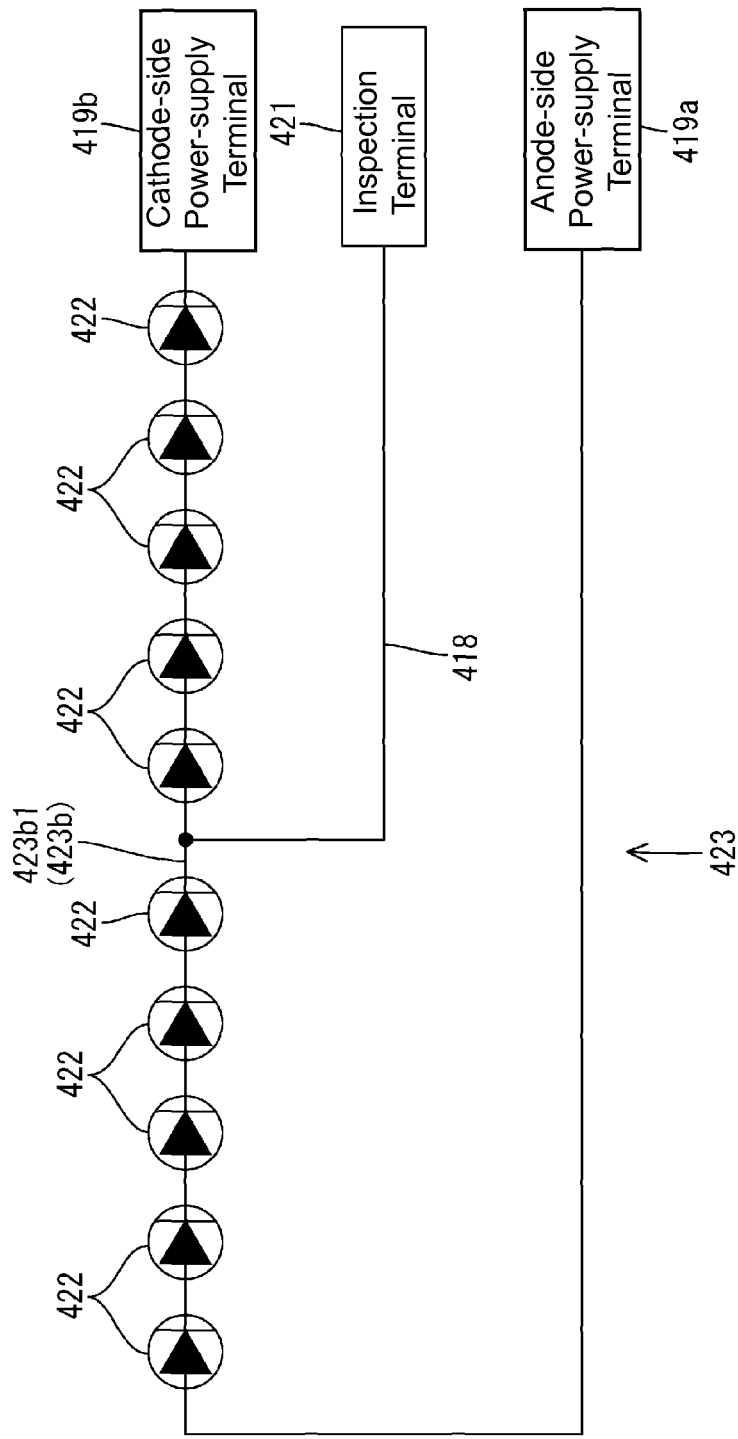
FIG. 12 is a circuit diagram that illustrates an electrical connection configuration of LEDs in an LED substrate.

Next, the LED substrate 423 on which the LEDs 422 are mounted will be described. As shown in FIGS. 10 to 12, the LED substrate 423 has a substrate section 423a that has rectangular shape in a plan view, and is housed inside the chassis 39 while extending along the bottom plate 39a. The long side direction of the LED substrate 423 corresponds to the X axis direction while the short side direction thereof corresponds to the Y axis direction. The LEDs 422 are surface mounted on the face (the face facing the optical sheet 425) of the substrate section 423a of the LED substrate 423 that faces toward the front. A total of 18 LED substrates 423 are disposed on the bottom plate 39a of the chassis 39. The LED substrates 423 are arranged two deep in the X axis direction and nine deep in the Y axis direction, respectively. A total of ten LEDs 422 are arranged in a straight line with prescribed gaps therebetween on the surface of the substrate section 423a of the LED substrate 423 in the long side direction thereof. A power supply wiring line 423b connects the ten LEDs 422, which are arranged in a straight line on the substrate section 423a, in series. An inspection wiring line 418 is connected to a substantially central location of a first extension section 423b1 that forms a part of the power supply wiring line 423b. The inspection wiring line 418 is formed such that five LEDs 422 are interposed between the inspection wiring line 418 and an anode-side power supply terminal 419a, and five LEDs 422 are interposed between the inspection wiring line 418 and a cathode-side power supply terminal 419b. Even in such a configuration, n1, which is the number of LEDs 422 interposed between an inspection terminal 421 of the inspection wiring line 418 and the anode-side power supply terminal 419a, and n2, which is the number of LEDs 422 interposed between the inspection terminal 421 of the inspection wiring line 418 and the cathode-side power supply terminal 419b, respectively satisfy formulas (2) and (3) from Embodiment 1. In addition, "n," which is the number of LEDs 422 connected to the power supply wiring line 423b, satisfies formula (1) from Embodiment 1.

The diffusion lenses 41 are made of a synthetic resin material (such as a polycarbonate or acryl, for example) that is almost completely transparent (having a high degree of light transmittance) and that has a refractive index higher than air. As shown in FIGS. 10 and 11, the diffusion lenses 41 have a prescribed thickness and are formed in a substantially circular shape in a plan view. The diffusion lenses 41 are also attached to the LED substrate 423 so as to respectively cover the respective LEDs 422. In other words, the diffusion lenses 41 respectively correspond in position to the LEDs 422 in a plan view. The diffusion lenses 41 can diffuse light having a high degree of directionality from the LEDs 422 and then output this light. In other words, the directionality of the light emitted from the LEDs 422 is lessened as the light passes through the diffusion lenses 41, and therefore, even when a gap between adjacent LEDs 422 is made larger, a region therebetween becomes less likely to be perceived as a dark area. This makes it possible to reduce the number of LEDs 422 that need to be provided. The diffusion lenses 41 are positioned such that the respective centers thereof substantially match the centers of the respective LEDs 422 in a plan view.

The substrate holding members 42 are made of a synthetic resin such as a polycarbonate and the surface thereof has a white color having excellent light reflectivity. As shown in FIGS. 10 and 11, the substrate holding members 42 respectively include a main body along the surface of the LED substrate 423, and a fixing member that protrudes toward the rear of the main body, or in other words, protrudes toward the chassis 39, and then fixes to the chassis 39. From among the substrate holding members 42, a pair of substrate holding members 42 disposed towards the center of the screen are provided with supporting members that protrude toward the front from the main body. The optical sheets 425 can be supported from the rear by these supporting members.

As shown in FIGS. 10 and 11, the reflective sheet 43 has a size so as to cover almost the entire inner surface of the chassis 39; in other words, the size is large enough to cover the entire LED substrate 423 disposed along the bottom plate 39a in a plan view. The reflective sheet 43 can reflect light inside the chassis 39 towards the optical sheets 425. The reflective sheet 43 is formed of: a bottom section 43a that extends along the bottom plate 39a of the chassis 39 and that has a size large enough to cover a large portion of the bottom plate 39a; four rising sections 43b that rise toward the front from the respective outer edges of the bottom plate 43a and that are inclined with respect to the bottom section 43a; and extension sections 43c that extend toward the exterior from the outer edges of the rising sections 43b and that are placed on the supporting plates 39c of the chassis 39. The bottom section 43a of the reflective sheet 43 is disposed so as to overlap the front surface of the respective LED substrates 423, or in other words, to overlap the front of the mounting surface of the LEDs 422. Also, the reflective sheet 43 has holes in positions corresponding to holes through which the respective diffusion lenses 41 pass, and in positions corresponding to holes through which the respective substrate holding members 42 pass.

Embodiment 6

Embodiment 6 of the present invention will be described with reference to FIG. 13. An example is shown in Embodiment 6 in which the structure and the number of LED substrates 523 have been modified from Embodiment 1. Descriptions of structures, operations, and effects similar to those of Embodiment 1 will be omitted.

Figure 13:
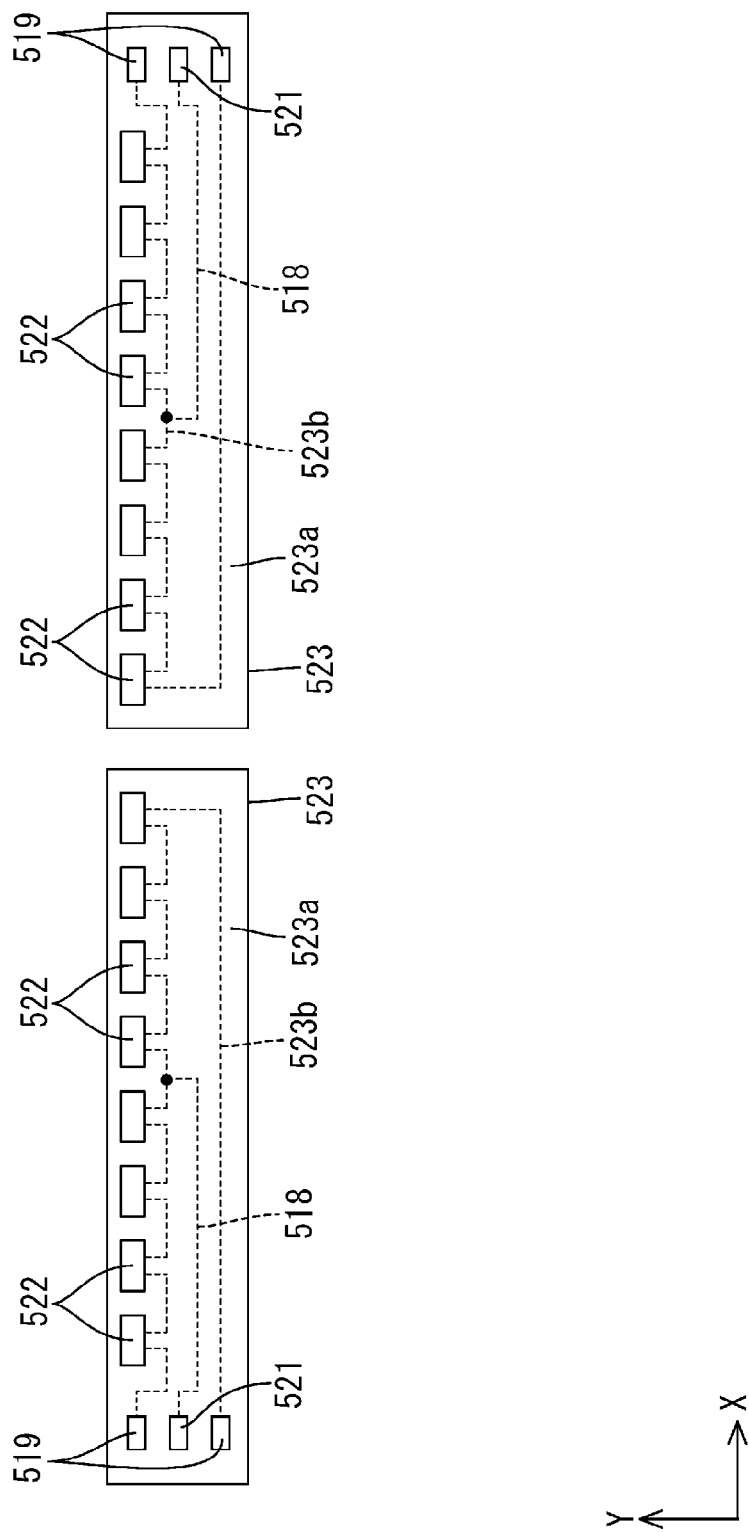
FIG. 13 is a bottom view of an LED substrate according to Embodiment 6 of the present invention.

As shown in FIG. 13, an LED substrate 523 of the present embodiment has eight LEDs 522 mounted on a substrate section 523a. The LED substrate 523 is configured such that only one power supply wiring line 523b system is disposed so as to connect the eight LEDs 522 in series. Two LED substrates 523 are used in the backlight device. Therefore, as with the power supply wiring line 523b, there is only one system of power supply terminals 519, inspection wiring lines 518, and inspection terminals 521 disposed on the substrate section 523a. In other words, two power supply terminals 519, one inspection wiring line 518, and one inspection terminal 521 are provided. The power supply terminals 519 and the inspection terminal 521 are disposed on one end of the substrate section 523a in the long side direction thereof; specifically, on the end opposite to an adjacent substrate 523 (in other words, the middle of the backlight device).

Embodiment 7

Embodiment 7 of the present invention will be described with reference to FIG. 14. An example is shown in Embodiment 7 in which the structure and the number of LED substrates 623 have been modified from Embodiment 6. Descriptions of structures, operations, and effects similar to those of Embodiment 6 will be omitted.

Figure 14:
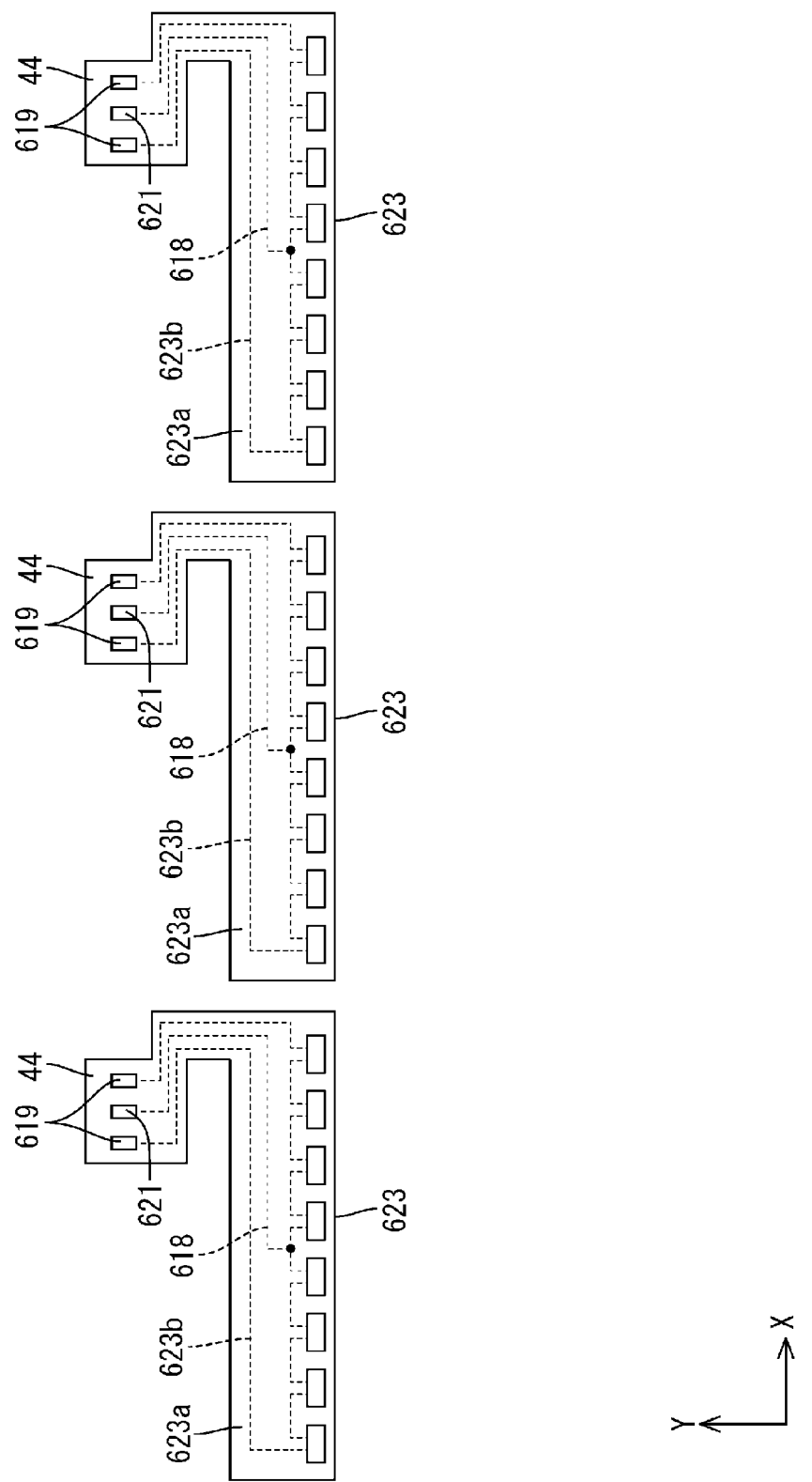
FIG. 14 is a bottom view of an LED substrate according to Embodiment 7 of the present invention.

As shown in FIG. 14, an LED substrate 623 according to the present embodiment has a protrusion 44 that protrudes along a short side direction (Y axis direction) from one end in a long side direction (X axis direction) of the substrate section 623a, and is configured such that power supply terminals 619 and an inspection terminal 621 are collectively disposed on the protrusion 44. Three LED substrates 623 are used in the backlight device. Therefore, a power supply wiring line 623b and an inspection wiring line 618 are drawn out so as to extend from the substrate section 623a to the protrusion 44. Respective ends of the power supply wiring line 623b are connected to the respective power supply terminals 619, and one end of the inspection wiring line 618 is connected to the inspection terminal 621. A power supply connector (not shown) and an inspection connector (not shown) are attached to the protrusion 44.

Other Embodiments

The present invention is not limited to the embodiments shown in the drawings and described above, and the following embodiments are also included in the technical scope of the present invention, for example.

Figure 15:
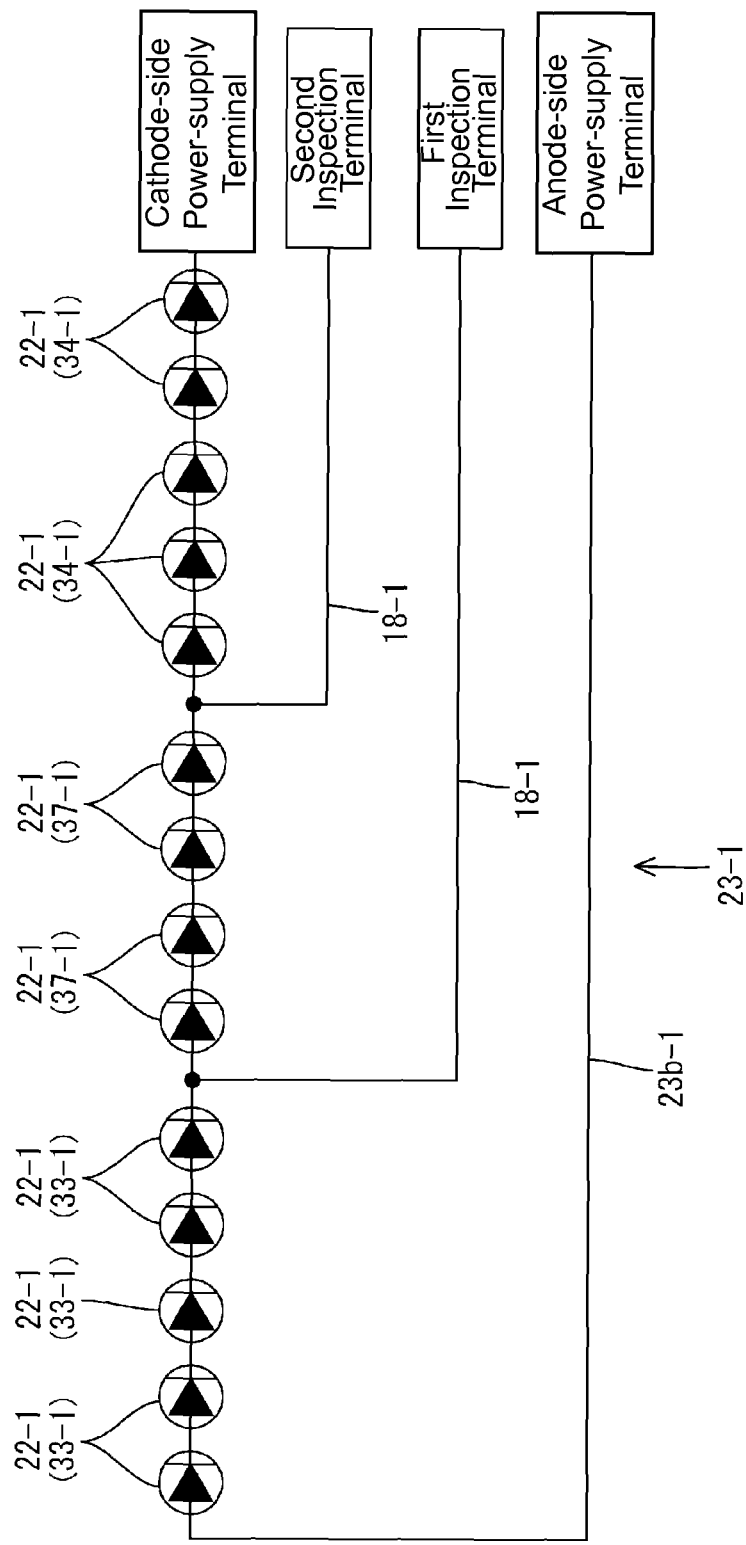
FIG. 15 is a circuit diagram that illustrates an electrical connection configuration of LEDs in an LED substrate according to Other Embodiment (1) of the present invention.

(1) In Embodiment 3, it is possible to appropriately modify the number of LEDs disposed on the LED substrate and the location at which the inspection wiring line connects to the power supply wiring line. Specifically, as shown in FIG. 15, it is possible to arrange a total of 14 LEDs 22-1 that connect to one power supply wiring line 23b-1 on an LED substrate 23-1, and to connect two inspection wiring lines 18-1 to the power supply wiring line 23b-1 such that a first LED array 33-1 is formed of five LEDs 22-1, a second LED array 34-1 is formed of five LEDs 22-1, and a third LED array 37-1 is formed of four LEDs 22-1. In other words, it is possible to set n1, which is the number of LEDs 22-1 in the first LED array 33-1, equal to n2, which is the number of LEDs 22-1 in the second LED array 34-1, and to set n3, which is the number of LEDs 22-1 in the third LED array 37-1, to be different from n1 and n2.

Figure 16:
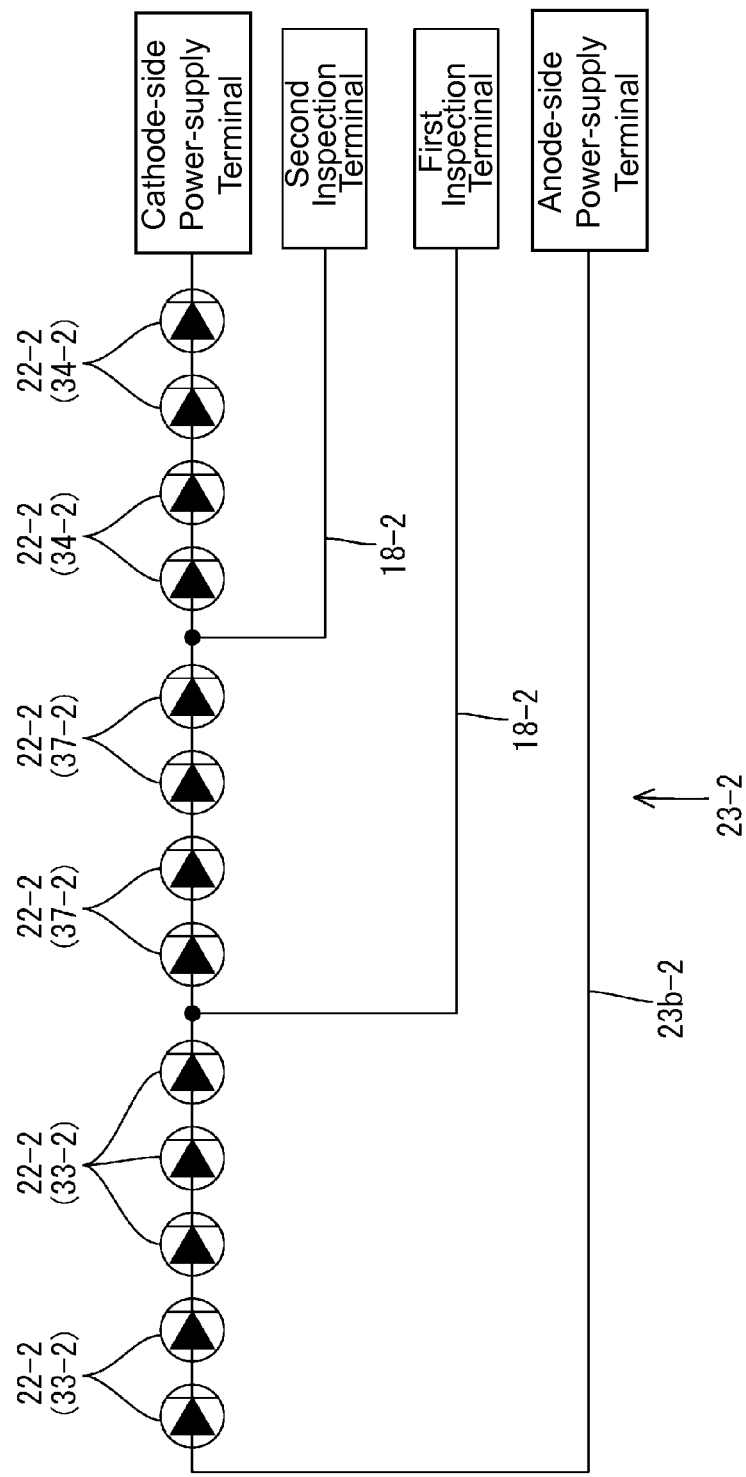
FIG. 16 is a circuit diagram that illustrates an electrical connection configuration of LEDs in an LED substrate according to Other Embodiment (2) of the present invention.

(2) An alternative to (1) is shown in FIG. 16. As shown in FIG. 16, it is possible to arrange a total of 13 LEDs 22-2 that connect to one power supply wiring line 23b-2 on an LED substrate 23-2, and to connect two inspection wiring lines 18-2 to the power supply wiring line 23b-2 such that a first LED array 33-2 is formed of five LEDs 22-2, a second LED array 34-2 is formed of four LEDs 22-2, and a third LED array 37-2 is formed of four LEDs 22-2. In other words, it is possible to set n2, which is the number of LEDs 22-2 in the second LED array 34-2, equal to n3, which is the number of LEDs 22-2 in the third LED array 37-2, and to set n1, which is the number of LEDs 22-2 in the first LED array 33-2, to be different from n2 and n3.

(3) As a further modification example to (2), it is possible to set n1 and n3, which are respectively the number of LEDs in the first LED array and the number of LEDs in the third LED array, equal to each other and set n2, which is the number of LEDs in the second LED array, to be different from n1 and n3.

(4) As a further modification example to (1) to (3), n1, n2, and n3, which are respectively the number of LEDs in the first LED array, the second LED array, and the third LED array, may each be set to a different number.

(5) In Embodiment 3, a configuration was used in which two inspection wiring lines were connected to one power supply wiring line. However, it is possible to use a configuration in which three or more inspection wiring lines are connected to one power supply wiring line. In such a case, LEDs connected to the one power supply wiring line will be divided into four or more groups and then inspected; thus, such a configuration is particularly suitable in cases in which there are more LEDs connected to one power supply wiring line and in cases in which the tolerance range for voltage drops of a single LED is higher. In this way, even in cases in which LEDs connected to one power supply wiring line are divided into four or more groups and then inspected, it is preferable that n1 to n3, which are the number of LEDs included in the respective groups (LED arrays), satisfy formulas (2) to (4) described in Embodiments 1 and 3 in order to guarantee inspection reliability.

(6) As in Embodiment 3, it is possible to appropriately modify the number of LEDs connected to the inspection wiring on an LED substrate that includes a plurality (two, for example) of inspection wiring lines. For example, when the tolerance range for voltage drops of a single LED is large, the values of n1 and n2 become small; thus, even if the number of LEDs connected to the power supply wiring lines is relatively small, there are cases in which in it is preferable that there are a plurality of inspection wiring lines.

(7) In addition to the above-mentioned embodiments, it is possible to appropriately modify n1 and n2, which represent the exact number of LEDs in the first LED array and the second LED array. Similarly, it is possible to appropriately modify n3, which represents the exact number of LEDs in the third LED array. Even in such a case, it is preferable that n1 to n3 respectively satisfy formulas (2) to (4) described in Embodiments 1 and 3 in order to guarantee inspection reliability.

(8) In the respective above-described embodiments, examples were described in which a power supply connector and/or an inspection connector were attached to the LED substrate. However, a connector that, like the inspection connector, has three terminal clamps may be used, and the connector may have both an inspection function and a power supply function.

(9) In the respective above-described embodiments (excluding Embodiment 4), the inspection may be conducted by causing the lead of the inspection device to contact the respective terminals on the LED substrate.

(10) In Embodiment 2, an example was described in which a Zener diode was used as a protection diode. However, it is possible to use an ordinary diode that is not a Zener diode. Even in such a case, if the diodes are connected to the LEDs in parallel such that the polarity becomes reversed, it is possible to protect the LEDs from current that is reverse-biased with respect to the LEDs. In addition, it is also possible to combine the configurations of Embodiments 3 to 7 with the configuration (protection diode) of Embodiment 2.

(11) In the respective above-described embodiments, an example was used in which an inspection wiring line was disposed on the substrate section so as to be sandwiched between a first extension section and a second extension section of a power supply wiring line. However, it is also possible to dispose the inspection wiring line on the substrate section so as to be disposed on the side of the first extension section that is opposite to the second extension section. Alternatively, it is possible to dispose the inspection wiring line on the substrate section so as to be disposed on the side of the second extension section that is opposite to the first extension section.

(12) In addition to the respective above-described embodiments, it is also possible to appropriately modify the arrangement of the power supply terminals and the inspection terminals on the substrate section.

(13) In the respective above-described embodiments, an LED substrate, in which LEDs were mounted on the substrate section, was described. However, the present invention can also be applied to a light source substrate on which another type of light source, such as an organic EL light source, has been mounted.

(14) In the respective above-described embodiments, an example was used in which the LED substrate was formed of a film-like base material. However, it is possible to use an LED substrate base material that has a plate-like shape with a uniform thickness.

(15) In the respective above-described embodiments, an example was used in which a touch panel was provided separately from a cover panel. However, it is possible to use a configuration in which the touch panel is omitted, and a touch panel pattern is directly formed on an inner surface of the cover panel that faces toward the liquid crystal panel such that the cover panel has a touch panel function.

(16) In the respective above-described embodiments, the touch panel pattern on the touch panel was of the projected capacitive type. Alternatively, the present invention can also be applied to a surface capacitive type, a resistive film type, or an electromagnetic induction type touch panel pattern, or the like.

(17) It is also possible to use, in place of the touch panel described in the respective above-described embodiments, a parallax barrier panel (a switch liquid crystal panel) that has a parallax barrier pattern for making images displayed on a display surface of a liquid crystal panel visible to a viewer as three-dimensional images by separating the images by parallax. In addition, it is possible to combine the above-described parallax barrier panel and touch panel.

(18) It is also possible to form a touch panel pattern on the parallax barrier panel described in (17) so as to have the parallax barrier panel double as a touch panel.

(19) In the respective above-described embodiments, an example was used of a liquid crystal display device that included a touch panel. It is possible to omit the touch panel, however. Similarly, it is also possible to omit the cover panel.

(20) In the respective above-described embodiments, an example was given of a liquid crystal display device that was utilized in a portable information terminal such as a tablet PC. However, the present invention may also be applied to a liquid crystal display device utilized in a portable information terminal that is smaller than a tablet PC, such as a smartphone or the like. In such a case, it is preferable that the screen size of the liquid crystal panel be approximately 4 inches to 7 inches. The screen size of the liquid crystal panel can also be suitably modified. In addition, besides smartphones and tablet PCs, the present invention can also be applied to liquid crystal display devices used in in-vehicle information terminals (portable car navigation systems), portable gaming devices, and the like, for example.

(21) In the respective above-described embodiments, an example was shown in which the colored portions of the color filter in the liquid crystal panel were the three colors R, G, and B, but it is possible for the colored portions to include four or more colors.

(22) In the respective above-described embodiments, the cover panel was made of tempered glass that had been chemically strengthened. However, tempered glass that has been strengthened by air cooling (physical strengthening) may also be used.

(23) In the respective above-described embodiments, the cover panel was made of reinforced glass. However, an ordinary glass material (non-tempered glass) or a synthetic resin material may also be used.

(24) In the respective above-described embodiments, a TFT was used as a switching element in the liquid crystal display device. However, the present invention can also be applied to a liquid crystal display device that includes a switching element other than a TFT (such as a thin film diode (TFD)), and, besides a color liquid crystal display device, the present invention can also be applied to a black and white liquid crystal display device.

DESCRIPTION OF REFERENCE CHARACTERS 10, 410 liquid crystal display device (display device)
11, 411 liquid crystal panel (display panel)
13, 413 backlight device (illumination device)
18, 118, 218, 318, 418, 518, 618 inspection wiring line
19, 319, 519, 619 power supply terminal
21, 121, 221, 321, 421, 521, 621 inspection terminal
22, 122, 222, 422, 522 LED (light source)
23, 123, 223, 323, 423, 523, 623 LED substrate (light source substrate)
23a, 323a, 523a, 623a substrate section
23b, 123b, 223b, 323b, 423b, 523b, 623b power supply wiring line
36 protection diode
n integer
n1 integer
n2 integer
n3 integer
Vfmin minimum value
Vzmin minimum value
ΔVf difference
ΔVfg difference

What is claimed is:

1. A light source substrate, comprising:
a substrate;
a plurality of light sources mounted on the substrate;
a power supply wiring line on the substrate, connecting said plurality of light sources in series so as to supply power to the plurality of light sources; and
an inspection wiring line that is disposed on the substrate and connected to a portion of the power supply wiring line that connects adjacent light sources included in the plurality of light sources,
wherein the plurality of light sources each include a semiconductor light-emitting element, and
wherein the light source substrate further comprises a plurality of protection diodes that are each connected in parallel to a respectively different light source included in the plurality of light sources, and that have a polarity that is a reverse of a polarity of the light sources.

2. The light source substrate according to claim 1, wherein the inspection wiring line is connected to the power supply wiring line such that ΔVfg is less than Vfmax, where ΔVfg is a difference between a maximum value and a minimum value of a tolerance for a voltage drop between the inspection wiring line and one end or another end of the power supply wiring line, as calculated from a specified tolerance for a voltage drop at a single one of the plurality of light sources, and Vfmax is a maximum value of the specified tolerance for the voltage drop at the single one of the plurality of light sources.

3. The light source substrate according to claim 1, wherein the inspection wiring line is connected to the power supply wiring line such that n is greater than Vfmax/ΔVf, and n1 and n2 are respectively less than Vfmax/ΔVf, where ΔVf is a difference between a maximum value and a minimum value for a voltage drop at a single light source included in the plurality of light sources, Vfmax is a maximum value of a tolerance for the voltage drop at said single light source, n is a total number of light sources included in the plurality of light sources, n1 is a number of light sources disposed between the inspection wiring line and one end of the power supply wiring line, and n2 is a number of light sources disposed between the inspection wiring line and another end of said power supply wiring line.

4. The light source substrate according to claim 3, wherein the inspection wiring line is connected to the power supply wiring line such that n1 and n2 are equal to each other.

5. The light source substrate according to claim 1, wherein a plurality of the inspection wiring lines are disposed on the substrate so as to be connected to different portions of the power supply wiring line such that light sources included in the plurality of light sources are interposed therebetween.

6. The light source substrate according to claim 5, wherein the plurality of inspection wiring lines are connected to the power supply wiring line such that n3 is less than Vfmax/ΔVf and n is greater than Vfmax/ΔVf, where ΔVf is a difference between a maximum value and a minimum value for a voltage drop at a single one of the plurality of light sources, Vfmax is a maximum value of a tolerance for the voltage drop at said single light source, n is a total number of light sources included in the plurality of light sources, and n3 is a number of the light sources disposed between any pair of the inspection wiring lines that are adjacent to each other in the plurality of inspection wiring lines.

7. The light source substrate according to claim 1, wherein the plurality of protection diodes are Zener diodes that have a Zener voltage that is larger than a voltage drop at a single one of the plurality of light sources.

8. The light source substrate according to claim 7, wherein the inspection wiring line is connected to the power supply wiring line such that ΔVfg is smaller than Vfmax and is also smaller than Vzmin, where ΔVfg is a difference between a maximum value and a minimum value of a tolerance for a voltage drop between the inspection wiring line and one end or another end of the power supply wiring line, as calculated from a specified tolerance for a voltage drop at a single one of the plurality of light sources, Vfmax is a maximum value of the specified tolerance for the voltage drop at said single light source included in the plurality of light sources, and Vzmin is a minimum value of a specified tolerance for Zener voltage of a single one of the plurality of Zener diodes.

9. A display device, comprising:
an illumination device that has at least the light source substrate according to claim 1; and
a display panel that displays images by utilizing light from the illumination device.

10. A light source substrate, comprising:
a substrate;
a plurality of light sources mounted on the substrate;
a power supply wiring line on the substrate, connecting said plurality of light sources in series so as to supply power to the plurality of light sources; and
an inspection wiring line that is disposed on the substrate and connected to a portion of the power supply wiring line that connects adjacent light sources included in the plurality of light sources;
a power supply terminal that is disposed on an end of the substrate and that is connected to an end of the power supply wiring line; and an inspection terminal that is disposed adjacent to said power supply terminal on the end of the substrate and that is connected to an end of the inspection wiring line.

11. The light source substrate according to claim 10, wherein the inspection wiring line is connected to the power supply wiring line such that $\Delta Vfg$ is less than Vfmax, where $\Delta Vfg$ is a difference between a maximum value and a minimum value of a tolerance for a voltage drop between the inspection wiring line and one end or another end of the power supply wiring line, as calculated from a specified tolerance for a voltage drop at a single one of the plurality of light sources, and Vfmax is a maximum value of the specified tolerance for the voltage drop at the single one of the plurality of light sources.

12. The light source substrate according to claim 10, wherein the inspection wiring line is connected to the power supply wiring line such that n is greater than Vfmax/$\Delta Vf$, and n1 and n2 are respectively less than Vfmax/$\Delta Vf$, where $\Delta Vf$ is a difference between a maximum value and a minimum value for a voltage drop at a single light source included in the plurality of light sources, Vfmax is a maximum value of a tolerance for the voltage drop at said single light source, n is a total number of light sources included in the plurality of light sources, n1 is a number of light sources disposed between the inspection wiring line and one end of the power supply wiring line, and n2 is a number of light sources disposed between the inspection wiring line and another end of said power supply wiring line.

13. The light source substrate according to claim 12, wherein the inspection wiring line is connected to the power supply wiring line such that n1 and n2 are equal to each other.

14. The light source substrate according to claim 10, wherein a plurality of the inspection wiring lines are disposed on the substrate so as to be connected to different portions of the power supply wiring line such that light sources included in the plurality of light sources are interposed therebetween.

15. The light source substrate according to claim 14, wherein the plurality of inspection wiring lines are connected to the power supply wiring line such that n3 is less than Vfmax/$\Delta Vf$ and n is greater than Vfmax/$\Delta Vf$, where $\Delta Vf$ is a difference between a maximum value and a minimum value for a voltage drop at a single one of the plurality of light sources, Vfmax is a maximum value of a tolerance for the voltage drop at said single light source, n is a total number of light sources included in the plurality of light sources, and n3 is a number of the light sources disposed between any pair of the inspection wiring lines that are adjacent to each other in the plurality of inspection wiring lines.

16. A display device, comprising:
an illumination device that has at least the light source substrate according to claim 10; and
a display panel that displays images by utilizing light from the illumination device.

17. A method for inspecting a light source substrate that comprises: a substrate; a plurality of light sources mounted on the substrate; a power supply wiring line on the substrate, connecting said plurality of light sources in series so as to supply power to the plurality of light sources; and an inspection wiring line that is disposed on the substrate and connected to a portion of the power supply wiring line that connects adjacent light sources included in the plurality of light sources, the method comprising:
a first voltage measurement step that measures a voltage drop between the inspection wiring line and one end of the power supply wiring line that is opposite to the inspection wiring line;
a first determination step that determines whether or not there is a defect in the light sources disposed between the inspection wiring line and said one end of the power supply wiring line by comparing the voltage drop measured during the first voltage measurement step to a reference value;
a second voltage measurement step that measures a voltage drop between the inspection wiring line and another end of the power supply wiring line; and
a second determination step that determines whether or not there is a defect in the light sources disposed between the inspection wiring line and said another end of the power supply wiring line by comparing the voltage drop measured during the second voltage measurement step to a reference value.

* * * * *